(12) United States Patent
Sugihara et al.

(10) Patent No.: US 7,577,552 B2
(45) Date of Patent: Aug. 18, 2009

(54) CALCULATION METHOD FOR PACKING WIRE MATERIALS, CALCULATION APPARATUS USING THE SAME AND COMPUTER-READABLE RECORDING MEDIUM

(75) Inventors: Kokichi Sugihara, Bunkyo-ku (JP); Masayoshi Sawai, Kosai (JP); Kohki Nagakura, Kosai (JP)

(73) Assignee: Yazaki Corporation, Tokyo (JP)

( * ) Notice: Subject to any disclaimer, the term of this patent is extended or adjusted under 35 U.S.C. 154(b) by 596 days.

(21) Appl. No.: 11/052,815

(22) Filed: Feb. 9, 2005

(65) Prior Publication Data

US 2005/0197810 A1 Sep. 8, 2005

(30) Foreign Application Priority Data

Feb. 18, 2004 (JP) ............... P.2004-041641

(51) Int. Cl.
*G06F 17/50* (2006.01)
(52) U.S. Cl. .............................. 703/1; 703/2
(58) Field of Classification Search ............. 703/1, 703/2
See application file for complete search history.

(56) References Cited

U.S. PATENT DOCUMENTS

| 4,647,474 | A * | 3/1987 | Masuda et al. ............. 427/498 |
| 7,337,096 | B2 * | 2/2008 | Sugihara et al. ............. 703/1 |
| 7,480,594 | B2 * | 1/2009 | Sugihara et al. ............. 703/1 |
| 2005/0150680 | A1 * | 7/2005 | Sugihara et al. ........... 174/128.1 |
| 2006/0096372 | A1 * | 5/2006 | Sugihara et al. ........... 73/432.1 |

FOREIGN PATENT DOCUMENTS

| JP | 2004-127917 A | 4/2004 |
| WO | 2004/013778 A2 | 2/2004 |

OTHER PUBLICATIONS

Arai et al., "A Strategy for Packing Circles: Vibration Control Approach", Intelligent Engineering Systems Through Artificial Neural Networks, vol. 7, Jul. 1997, pp. 931-938.*
Huang et al: "Local Search Based on a Physical Model for Solving a Circle Packing Problem" MIC 2001 4th Metaheuristics International Conference, Jul. 2001, pp. 455-459.*

* cited by examiner

*Primary Examiner*—Kamini S Shah
*Assistant Examiner*—Herng-Der Day
(74) *Attorney, Agent, or Firm*—Sughrue Mion, PLLC

(57) ABSTRACT

A calculation method includes the steps of: setting a moving condition about the respective wire materials; regarding cross-sectional shapes of the wire materials as a plurality of circles; assuming a comprehensive circle containing the circles; defining a target circle which is slightly smaller than the comprehensive circle; searching for a destination position into which the circles excluding an insertion-tried circle is moved as farther as possible from the insertion-tried circle; inserting the insertion-tried circle into a space within the target circle; defining a new target circle that is slightly smaller than the present target circle when all the insertion-tried circle is inserted in the target circle, and returning to the searching step; repetitively performing the defining step, the searching step, the insertion step, and defining step of the new target circle for reducing the comprehensive circle; and determining information about positions of the comprehensive circle and the circles.

4 Claims, 20 Drawing Sheets

FIG. 5A

| WIRE ID | CENTER POSITION OF WIRE | | WIRE RADIUS | WIRE CHARACTER |
|---|---|---|---|---|
| 1 | x1 | y1 | r1 | COMPOSIT a |
| 2 | x2 | y2 | r2 | COMPOSIT a |
| 3 | x3 | y3 | r3 | COMPOSIT a |
| 4 | x4 | y4 | r4 | COMPOSIT a |
| 5 | x5 | y5 | r5 | SINGLE |
| 6 | x6 | y6 | r6 | SINGLE |
| 7 | x7 | y7 | r7 | SINGLE |
| ⋮ | ⋮ | ⋮ | ⋮ | ⋮ |

FIG. 5B

| WIRE ID | CENTER POSITION OF WIRE | | WIRE RADIUS | WIRE CHARACTER | CENTER POSITION OF COMPREHENSIVE CIRCLE | | RADIUS OF COMPREHENSIVE CIRCLE |
|---|---|---|---|---|---|---|---|
| 1 | x1' | y1' | r1 | COMPOSIT a | X1 | Y1 | R1 |
| 2 | x2' | y2' | r2 | COMPOSIT a | | | |
| 3 | x3' | y3' | r3 | COMPOSIT a | | | |
| 4 | x4' | y4' | r4 | COMPOSIT a | | | |
| 5 | x5' | y5' | r5 | SINGLE | | | |
| 6 | x6' | y6' | r6 | SINGLE | | | |
| 7 | x7' | y7' | r7 | SINGLE | | | |
| .... | .... | .... | .... | .... | | | |

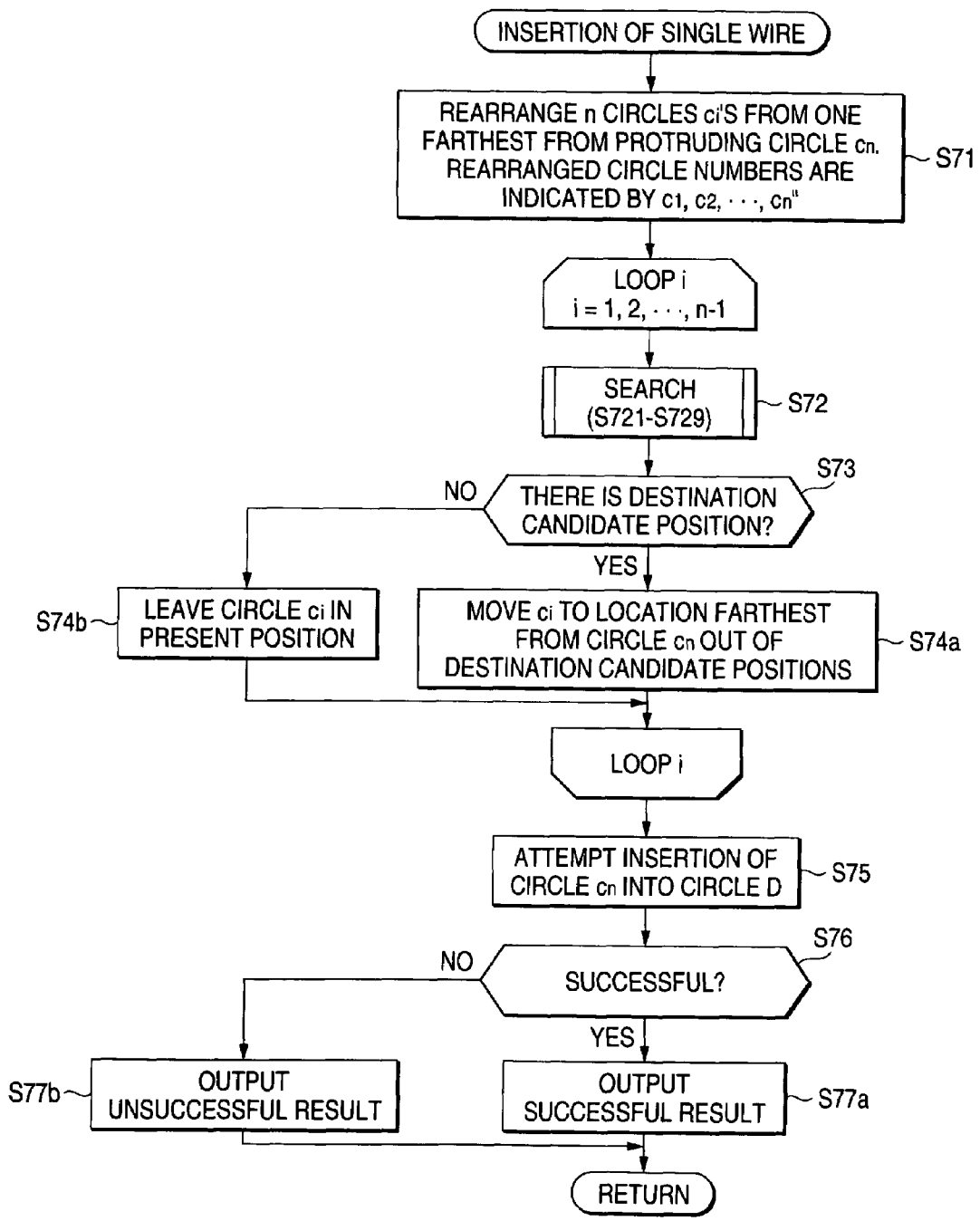

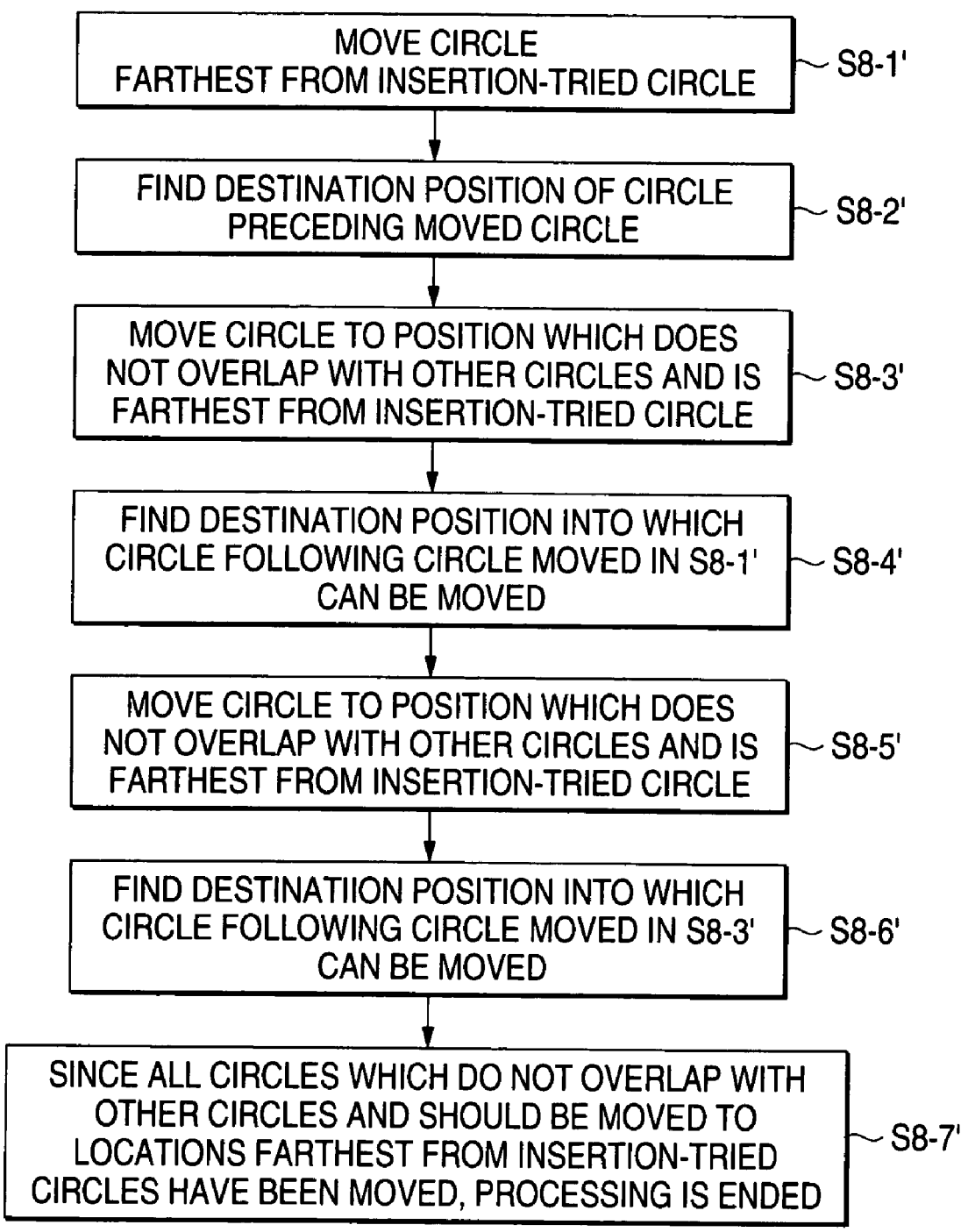

CALCULATION METHOD FOR PACKING WIRE MATERIALS, CALCULATION APPARATUS USING THE SAME AND COMPUTER-READABLE RECORDING MEDIUM

BACKGROUND OF THE INVENTION

The present invention relates to a calculation method for packing plural wire materials forming a wiring harness or the like as compactly as possible, a calculation apparatus using the same and a computer-readable recording medium, and more particularly, to a calculation method for packing plural wire materials so as to satisfy conditions under which wire materials are respectively moved, a calculation apparatus using the same and a computer-readable recording medium.

Wire-like structures known as wiring harnesses formed by binding together plural wire materials such as electric wires are provided in vehicles and indoors. The harnesses act to electrically connect electric appliances, electronic components, and so on. In recent years, such a wiring harness has been required to be made as compactly as possible without impairing the electrical characteristics from a viewpoint of improvements of the space efficiency. Concomitantly, it becomes necessary to calculate the most compact wiring harness in the design stage. In the past, however, any specific and efficient calculation method for this purpose has not been proposed.

Accordingly, the present applicant and others have proposed a calculation method in JP-A-2004-127917 to gain information about the outside diameter of a wire cable obtained by binding and packing plural wire materials and information about the positions of the wire materials, using a computer. The wire cable is formed by binding circles corresponding to the cross-sectional shapes of the wire materials into a minimally sized circular form such that the circles do not overlap with each other. This makes it possible to calculate a comprehensive circle when plural circles are bound and packed into a minimally sized circular form such that the circles do not overlap with each other. Heretofore, it has been considered to be difficult to perform this calculation. Note that the comprehensive circle corresponds to the cross section of the wiring harness created by binding the plural wire materials.

In reality, however, electric wires forming wiring harnesses are not limited to single wires, or single electric wires. In addition, as shown in FIG. 4A, there exist composite wires known as twisted wire 8 or flat wire 9. The twisted wire 8 is obtained by twisting together plural electric wires 81. The flat wire 9 is obtained by connecting plural electric wires 91 along a flat plane. Numerals 82 and 92 indicate conductor lines in the electric wires 81 and 91, respectively. Each electric wire forming this kind of composite wire must be packed as a unit. Some electric wires (not shown) are preferably placed more outwardly than other electric wires. Conversely, some electric wires are preferably placed inwardly of other electric wires so as to be surrounded by them. That is, in reality, it may not be possible that electric wires can be moved at will and packed. In many cases, electric wires are restricted to their respective given moving conditions.

However, the method of JP-A-2003-179718 proposes a fundamental technique for binding together and packing plural wire materials into a minimally sized circular form. In this method, conditions under which the wire materials are moved (hereinafter may be referred to as the "movement conditions") are not established. That is, circles corresponding to the wire materials can be moved at will according to results of calculations for packing.

Therefore, when calculations for packing are performed in a case where composite wires as described above are contained or the locations where the wire materials are placed are specified, it has been impossible to directly apply the method of JP-A-2003-179718. Any efficient calculation method for packing plural wire materials while satisfying movement conditions as described above has not yet been proposed.

SUMMARY OF THE INVENTION

Therefore, in view of the foregoing present circumstances, the present invention is intended to provide a calculation method capable of compactly packing wire materials while satisfying their respective movement conditions and a calculation apparatus using the same.

In order to achieve the above object, according to the present invention, there is provided a calculation method for packing a plurality of wire materials as compactly as possible, comprising the steps of:

setting a moving condition with respect to the respective wire materials;

regarding cross-sectional shapes of the plurality of wire materials as a plurality of circles having diameters corresponding to contours of the cross-sectional shapes;

assuming a comprehensive circle containing the plurality of circles which are arranged on a flat plane without overlapping with each other;

defining a target circle which is slightly smaller than the comprehensive circle and has the same center as the comprehensive circle such that at least one of the plurality of circles deviates from the target circle;

searching for a destination position into which the circles excluding an insertion-tried circle is moved as farther as possible from the insertion-tried circle within the target circle without overlapping with each other, the circle deviated from the target circle being regard as the insertion-tried circle;

inserting the insertion-tried circle into a space within the target circle, the space being formed by rearranging the plurality of circles such that circles respectively corresponding to the wire materials satisfy the moving condition, based on a result of the step of searching for the destination position;

defining a new target circle that is slightly smaller than the present target circle and that contains the insertion-tried circle in a case where an entire portion of the insertion-tried circle is inserted in the target circle, and returning to the step of searching for the destination position;

repetitively performing the step of defining the target circle, the step of searching for the destination position, the step of inserting the insertion circle, and the step of defining the new target circle for reducing the comprehensive circle; and determining information about positions of the comprehensive circle and the plurality of circles.

Preferably, the information about the positions of the comprehensive circle and of the plural circles is outputted.

Preferably, in the step of setting the moving condition, the moving condition has a connective relationship of certain wire materials corresponding to a composite wire in a case that the plurality of the wire materials include the composite wire configured by the certain wire materials.

Preferably, wherein in a case that the composite wire is included in the wire materials as the moving condition, in the step of inserting the insertion-tried circle and the step of searching for the destination position, the certain circles corresponding to the composite wire are respectively moved in accordance with the connective relationship corresponding to the composite wire and the whole composite wire is moved only when all the certain circles corresponding to the composite wire are movable.

Preferably, the calculation method further comprises the step of returning to the step of searching for the destination position after defining the new target circle to a further new circle having a size midway between the comprehensive circle and the present target circle, the further new target circle containing the insertion-tried circle in a case that insertion of the insertion-tried circles is impossible to achieve, the step of returning to the step of searching for the destination position after defining the target circle being repetitively carried out together with the step of defining the target circle, the step of searching for the destination positions, the step of inserting the insertion-tried circles, and the step of searching for the destination position.

Preferably, information for identifying the plurality of wire materials is previously assigned to the plurality of circles corresponding to the wire materials. The information is outputted at least one of the timings of before start and after end of the calculation for the packing.

According to the present invention, there is also provided a calculator apparatus for packing a plurality of wire materials as compactly as possible, the calculator apparatus comprising:

- a setting unit, which sets a moving condition with respect to the respective wire materials;
- a cross-sectional shape regarding unit, which regards cross-sectional shapes of the plurality of wire materials as a plurality of circles having diameters corresponding to contours of the cross-sectional shapes;
- a comprehensive circle-assuming unit, which assumes a comprehensive circle containing the plurality of circles which are arranged on a flat plane without overlapping with each other;
- a target circle-defining unit, which defines a target circle which is slightly smaller than the comprehensive circle and has the same center as the comprehensive circle such that at least one of the plurality of circles deviates from the target circle;
- a search unit, which searches for a destination position into which the circles excluding an insertion-tried circle is moved as farther as possible from the insertion-tried circle within the target circle without overlapping with each other, the circle deviated from the target circle being regard as the insertion-tried circle;
- an insertion unit, which inserts the insertion-tried circle into a space within the target circle, the space being formed by rearranging the plurality of circles such that circles respectively corresponding to the wire materials satisfy the moving condition, based on a result of a process of the search unit; and
- a search control unit, which defines a new target circle that is slightly smaller than the present target circle and that contains the insertion-tried circle in a case where an entire portion of the insertion-tried circle is inserted in the target circle, and returning to the step of searching for the destination position, wherein the processings of the target circle-defining unit, the search unit, the insertion unit, and the search control unit are repetitively performed so that information about positions of the comprehensive circle and the plurality of circles are determined.

According to the present invention, there is also provided a computer-readable recording medium for causing a computer to execute the calculation method of the steps of:

- setting a moving condition with respect to the respective wire materials;
- regarding cross-sectional shapes of the plurality of wire materials as a plurality of circles having diameters corresponding to contours of the cross-sectional shapes;
- assuming a comprehensive circle containing the plurality of circles which are arranged on a flat plane without overlapping with each other;
- defining a target circle which is slightly smaller than the comprehensive circle and has the same center as the comprehensive circle such that at least one of the plurality of circles deviates from the target circle;
- searching for a destination position into which the circles excluding an insertion-tried circle is moved as farther as possible from the insertion-tried circle within the target circle without overlapping with each other, the circle deviated from the target circle being regard as the insertion-tried circle;
- inserting the insertion-tried circle into a space within the target circle, the space being formed by rearranging the plurality of circles such that circles respectively corresponding to the wire materials satisfy the moving condition, based on a result of the step of searching for the destination position;
- defining a new target circle that is slightly smaller than the present target circle and that contains the insertion-tried circle in a case where an entire portion of the insertion-tried circle is inserted in the target circle, and returning to the step of searching for the destination position;
- repetitively performing the step of defining the target circle, the step of searching for the destination position, the step of inserting the insertion circle, and the step of defining the new target circle for reducing the comprehensive circle; and
- determining information about positions of the comprehensive circle and the plurality of circles.

According to the above methods and configurations of the invention, plural wire materials can be packed efficiently and compactly. In addition, the comprehensive circle is found so as to satisfy the conditions under which the wire materials are respectively moved. Consequently, calculations for packing can be performed according to actual circumstances.

According to the above method of the invention, a connective relationship corresponding to a composite wire is established. Therefore, calculations for packing a wiring harness including a twisted wire, flat wire, or the like can be performed.

According to the above method of the invention, circles corresponding to the composite wire are moved in a given order while satisfying the connective relationship corresponding to the composite wire, and the whole composite wire is moved only when all the circles corresponding to the composite wire are movable. Therefore, calculations for movement of every kind of composite wire can be performed efficiently.

According to the above method of the invention, in a case where it is impossible to insert insertion-tried circles, a target circle midway in size between the comprehensive circle and the present target circle is defined. Then, the program returns to the searching step. Consequently, information about the positions of the packing comprehensive circle and of the wire materials forming the comprehensive circle can be gained more efficiently.

According to the above method of the invention, information which is used to identify the plural wire materials and has been previously assigned to the plural circles is added and outputted in a corresponding manner to the wire materials at least before start and after end of the calculations for the packing. In consequence, it is easy to track the destination positions of the plural wire materials.

BRIEF DESCRIPTION OF THE DRAWINGS

The above objects and advantages of the present invention will become more apparent by describing in detail preferred exemplary embodiments thereof with reference to the accompanying drawings, wherein:

FIG. 5A is a table showing an example of initial arrangement diagram;

FIG. 5B is a table showing an example of final arrangement diagram;

FIG. 7 is a flowchart illustrating processing for inserting single wires, the processing being shown in FIG. 3;

FIG. 16 is a flowchart illustrating the flow of processing in a case where movement is made from other than an end circle;

DETAILED DESCRIPTION OF THE PREFERRED EMBODIMENTS

Figure 1:
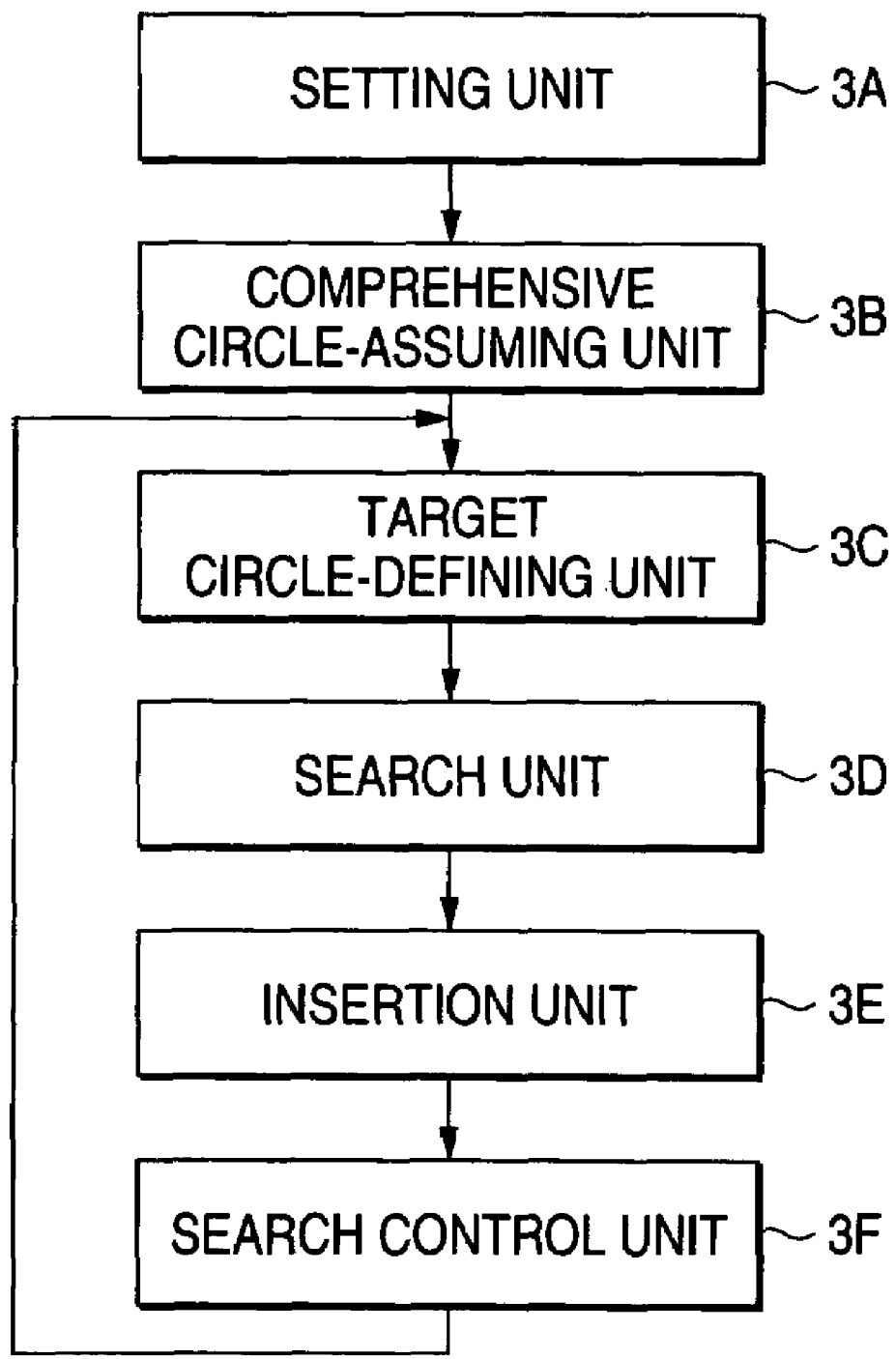
FIG. 1 is a block diagram showing the fundamental structure of the present invention.

Embodiments of the present invention are hereinafter described with reference to the drawings. First, a block diagram showing a fundamental structure according to an exemplary embodiment of the present invention is described by referring to FIG. 1. As shown in FIG. 1. the fundamental structure according to an exemplary embodiment of the present invention includes a setting unit 3A, a comprehensive circle-assuming unit 3B, a target circle-defining unit 3C, a search unit 3D, an insertion unit 3E, and a search control unit 3F. the hardware structure for realizing the present method for performing calculations for packing wire materials is described by referring to FIG. 2, which is a block diagram showing one example of the hardware structure for realizing the present invention.

Figure 2:
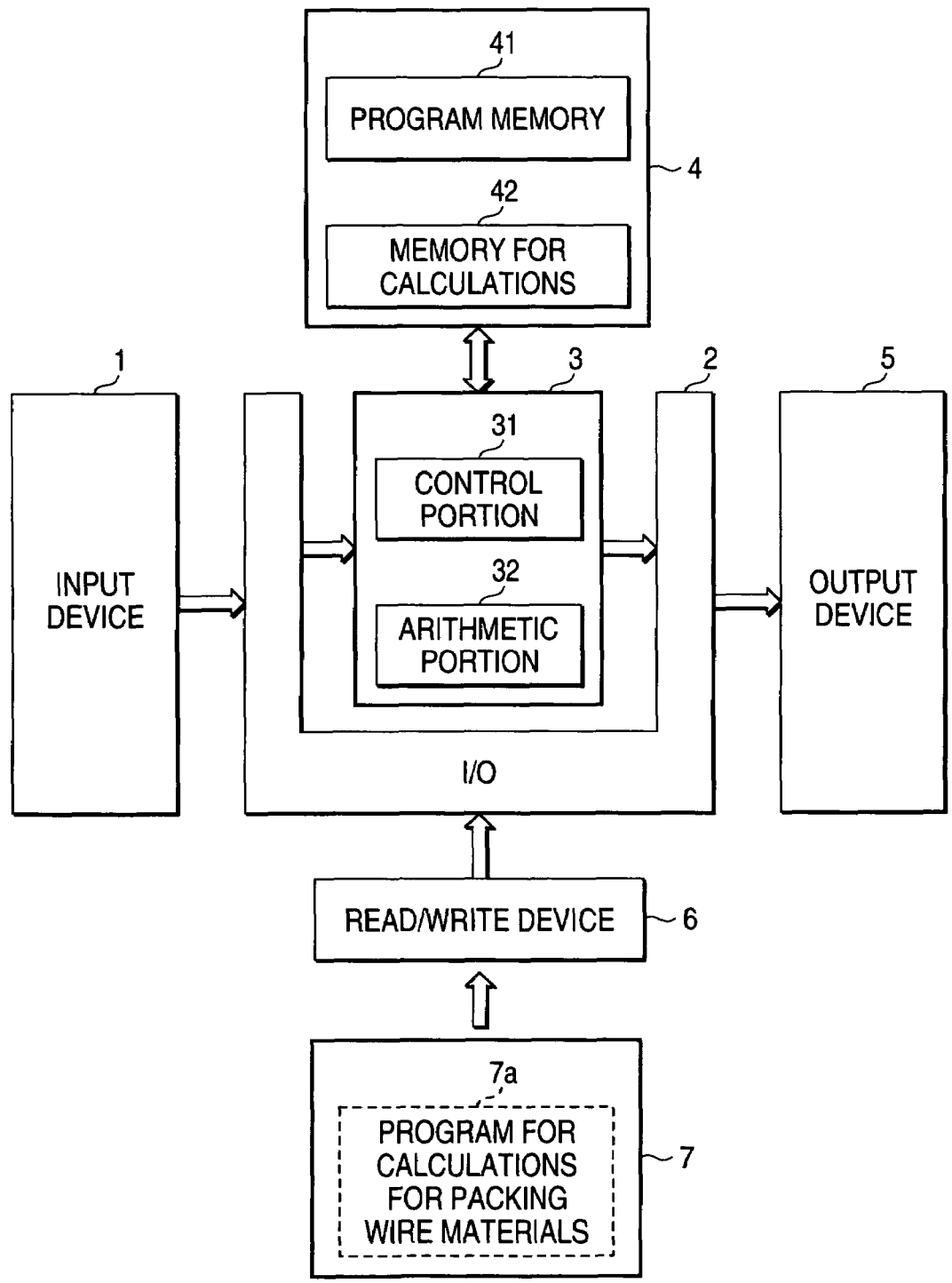
FIG. 2 is a block diagram showing one example of hardware structure for realizing the invention.

As shown in FIG. 2, the hardware structure is accomplished by a well-known personal computer, general-purpose computer, or the like. This computer includes an input device 1, I/O (input/output interface circuit) 2, a CPU (central processing unit) 3, a memory 4, an output device 5, and a read/write device 6. The input device 1, memory 4, output device 5, and read/write device 6 are electrically connected with the CPU 3 via the I/O 2.

The input device 1 is used to enter input data in processing described later. For example, the device is a keyboard or mouse device. The CPU 3 includes a control portion 31 for controlling the input device 1, output device 5, and so on and a computing portion 32 for performing processing (described later) associated with the present calculation method according to a program loaded in the memory 4.

The memory 4 includes a program memory 41 for storing a program corresponding to various processing steps associated with the present calculation method (described later) and a memory 42 for calculations. A working area for various processing steps performed by the CPU 3 is assigned to the memory 42 for calculations. The output device 5 is a monitor display or printing machine, for example, acting to output the results of processing performed by the CPU 3.

The read/write device 6 is a device for reading in a program 7a for performing calculations for packing wire materials in accordance with the present invention, the program 7a being stored in a recording medium 7 such as a CD or DVD. For example, the program 7a is a program executed in a processing sequence as shown in FIGS. 3, 7, 8, and 10 as described later. In addition, the device 6 transfers the program to the program memory 41. The read/write device 6 has an additional function of writing the results of calculations into the recording medium 7. The computer may include a communication interface such as a modem board or LAN card (not shown).

The CPU 3 installs the wire material packing calculation program 7a read out by the read/write device 6 into the program memory 41 of the memory 4. After the power has been turned on, this program 7a is activated. The computer acts as an apparatus for performing calculations for packing wire materials. The wire material packing calculation program 7a can also be installed in a different personal computer, general-purpose computer, or the like having the above-described configuration. After the installation, the computer functions as the apparatus for performing calculations for packing wire materials.

The wire material packing calculation program 7a is stored in the recording medium 7. The calculation program 7a may be supplied to this computer via a communication line such as the Internet, a dedicated line, or a LAN.

Figure 3:
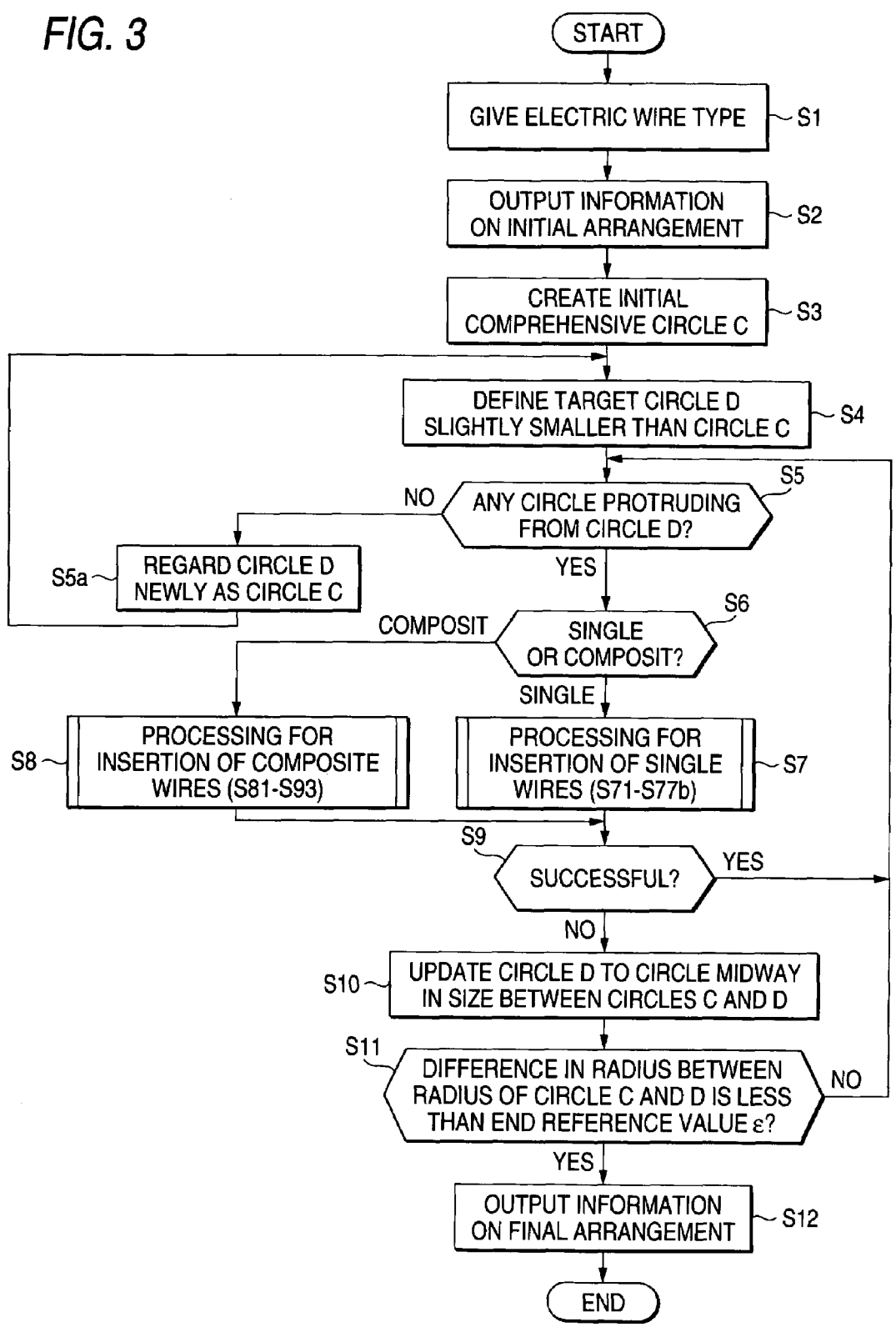
FIG. 3 is a flowchart illustrating a fundamental processing procedure associated with one embodiment of a calculation method of the invention.
Figure 4A:
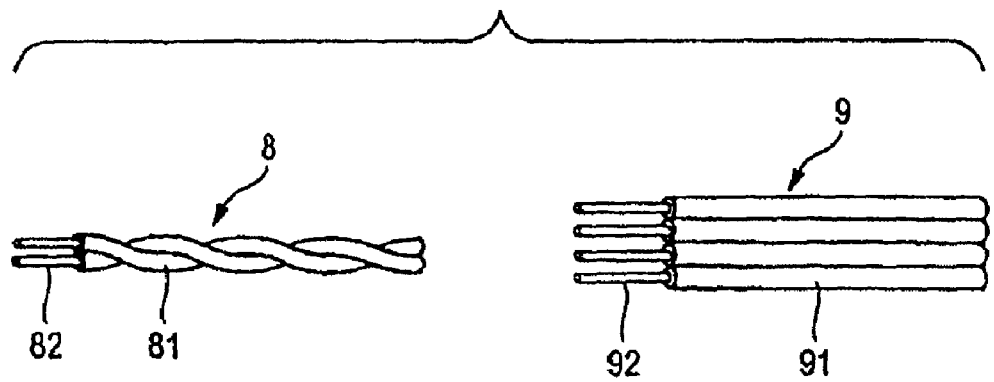
FIG. 4A is a view showing an example of composite wire.
Figure 4B:
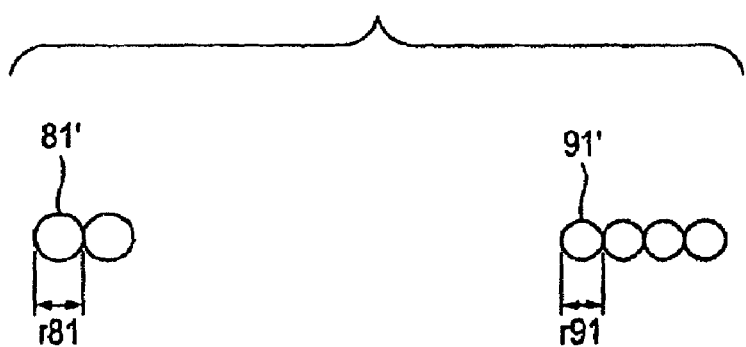
FIG. 4B is a view showing circles representing the composite wire of FIG. 4A.
Figure 6A:
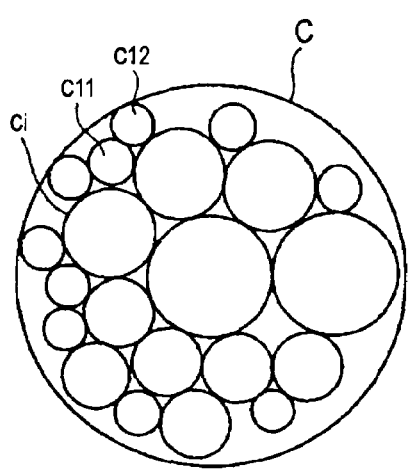
FIG. 6A shows an initial state.
Figure 6B:
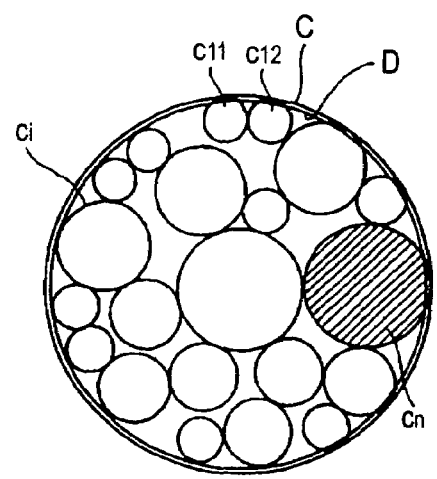
FIG. 6B shows insertion-tried circles protruding from a target circle.
Figure 6C:
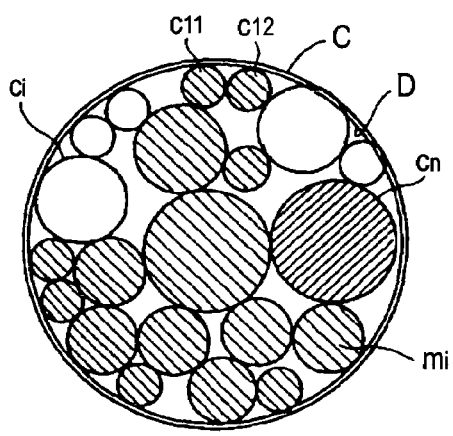
FIG. 6C shows the manner in which the insertion-tried circles of FIG. 6B have been inserted within the target circle.
Figure 6D:
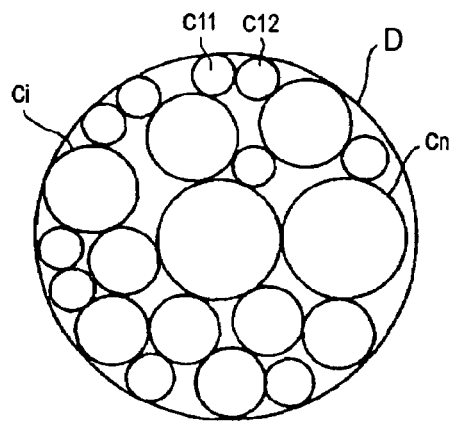
FIG. 6D shows the final result.

The fundamental processing procedure associated with one embodiment of the present invention is next described with reference to FIGS. 3 to 6. FIG. 3 is a flowchart illustrating the fundamental processing procedure associated with one embodiment of the calculation method of the invention. FIG. 4A shows an example of composite wire. FIG. 4B shows circles representing the composite wire of FIG. 4A. FIGS. 5A and 5B show examples of initial arrangement and final arrangement, respectively. FIG. 6A shows the initial state, FIG. 6B shows insertion-tried circles protruding from a target circle, FIG. 6C shows the manner in which the insertion-tried circles of FIG. 6B have been inserted in the target circle, and FIG. 6D shows the final results.

In the present calculation processing, the cross-sectional shapes of plural electric wires constituting a wiring harness are regarded as plural circles having diameters corresponding to the outer contours. Especially, with respect to a composite wire, circles corresponding to plural electric wires, respectively, are regarded to have been interconnected as shown in FIG. 4B. For example, with respect to twisted wire 8 shown in FIG. 4A, circles 81' each having a diameter r81 corresponding to the cross-sectional shape of each electric wire 81 are regarded to be in contact with each other as shown in FIG. 4B. With respect to flat wire 9 shown in FIG. 4A, circles 91' each having a diameter 91r corresponding to the cross-sectional shape of each electric wire 91 are regarded to be in contact with each other as shown in FIG. 4B. Calculationally, neither the location at which each circle 81' is in contact nor the location at which the circle 91' is in contact varies. It is assumed that the order in which three or more circles are arrayed like the circles 91' remains the same. The method is attributed to the problem that when n cylinders having cross sections represented by these circles are bound, the size of a circle surrounding the whole is examined. Practically, an effective calculation method of gaining the outside diameter of a wire cable using the computer is considered, the cable being obtained by binding and packing plural electric wires into a minimally sized circular form.

In the fundamental processing shown in FIG. 3, input information is given. The input information includes the radii $r_1$, $r_2$, ..., $r_n$ of n circles $c_1, c_2, ..., C_n$ corresponding to the contours of the cross-sectional shapes of plural electric wires such as conductors forming a wiring harness, a number $\rho$ which is smaller than unity but sufficiently close to unity (e.g., $\rho=0.95$), and an end reference value that is a sufficiently small positive number (e.g., the end reference value=min $((r_1, r_2, ..., r_n)/100)$). These pieces of information are set before the program goes to the processing procedure described later. Also, initial placement of the circles $c_1, c_2, ..., c_n$ is finished before the program goes to the processing procedure described later.

Output information includes the radius R of a minimum circle C in which the n circles $c_1, c_2, ..., c_n$ can be packed without overlapping with each other and information about the positions of the circles $c_1, c_2, ..., c_n$ assumed at this time.

First, in step S1 shown in FIG. 3, at least electric wire characteristics or type indicating whether it is a composite wire or single wire is given for each electric wire as conditions under which the n circles $c_1, c_2, ..., c_n$ corresponding to the electric wires are moved. Complementarily speaking, in the case of a composite wire, it is indicated that this electric wire belongs to a composite wire. In addition, information indicating to what composite wire does the electric wire belong is given like composite wire a shown in FIG. 5A, for example. For this purpose, the input device 1 can be utilized. Previously computerized data may also be used.

Next, in step S2, information about the initial arrangement is outputted by the output device 5. The information about the initial arrangement is shown, for example, in the form of a table as shown in FIG. 5A. The table includes electric wire IDs, electric wire center positions, electric wire radii, and electric wire types. The electric wire IDs are previously assigned for each circle $C_i$. With respect to composite wires, however, serial numbers of electric wire IDs are assigned according to the number of electric wires. The center positions (x1, y1), ..., (x7, y7), ... of the present circles $C_i$'s are displayed as the electric wire center positions. The radii r1, ..., r7 of the circles $c_i$'s are displayed as the electric wire radii. Furthermore, what is given in step S1 is displayed as an electric wire type. Preferably, an initial arrangement diagram as depicted as shown in FIG. 6A is also outputted as the information about the initial arrangement. In FIG. 6A, circles $c_{11}$ and $c_{12}$ correspond to the twisted wire 8 that is one kind of composite wire. The initial arrangement diagram and initial arrangement table may be printed out, in addition to displayed on a monitor display.

Then, in step S3, the circles $c_1, c_2, ..., c_n$ are arranged on a flat plane without overlapping with each other. A large circle surrounding them, i.e., a comprehensive circle C, is found.

Next, in steps S4, S5, and S5a, a circle (i.e., target circle D) that has the same center as the comprehensive circle C but has a radius which is $\rho$ times the radius of the comprehensive circle C, it being noted that the $\rho$ has been already defined. That is, in a loop consisting of step S4, a negative decision in step S5, and step S5a, the target circle D having the same center as that of the comprehensive circle C is defined. The target circle D is slightly smaller than the comprehensive circle C. At least one of the circles $c_1, c_2, ..., c_n$ protrudes from the comprehensive circle C. In the following processing steps, the arrangement is changed such that the circles $c_1, c_2, ..., c_n$ enter the target circle D.

Next, in step S6, a decision is made as to whether each circle $C_i$ belongs to a composite wire or single wire. If the decision is that it is a single wire, the program proceeds to the processing for inserting a single wire (step S7). If the decision is that it is a composite wire, the program goes to the processing for inserting a composite wire (step S8).

In step S7, the processing for inserting a single wire is performed. An arbitrary circle $C_i$ protrudes from the target circle D. In this processing for inserting a single wire, circles other than the protruding circle $C_i$ are taken out, from the arbitrary protruding circle $C_i$ in order of decreasing distance. A circle that can be placed into a more remote location is moved as farther as possible. Where it is impossible to make such a movement, the circle is left in the present position. Then, this one circle $C_i$ is moved into the space formed by the movement. That is, insertion is attempted. The processing of this step S7 will be described later with reference to FIGS. 7 and 8.

In step S8, processing for inserting a composite wire is performed. This processing for inserting a composite wire is similar to the processing for inserting a single wire but circles belonging to the composite wire are moved while maintaining a given connective relationship. Circles within the same composite wire are preferentially moved. After the end of processing of all the circles within the composite wire, the next circle is processed. The processing of this step S8 will be described later with reference to FIGS. 9-18.

Next, in step S9, a decision is made as to whether insertion of the circle $C_i$ in the steps S7 and S8 has been done successfully. If the decision is affirmative (YES), the program returns to step S5. Otherwise (the decision in step S9 is NO (negative)), the program goes to step S10. If the program returns to step S5, a decision is made as to whether there is any other protruding circle. If the decision is affirmative, the inserting processing of steps S7 and S8 is repeated for this protruding circle. If the decision is negative, the program proceeds to step S5a, and the aforementioned processing is performed.

On the other hand, in step S10, the target circle D is updated to a circle midway in size between the comprehensive circle C and the above-described target circle D for which the insertion has been done unsuccessfully. Then, in step S11, a decision is made as to whether the difference in radius between the comprehensive circle used for the processing of step S10 and the target circle D is less than the end reference value. If this difference is greater than the end reference value, the program returns to the step S5, and processing similar to the foregoing is performed (the decision in step S11 is negative). If the difference is less than the end reference value, the program goes to step S12 (the decision in step S11 is affirmative (YES)).

In step S12, the result of the calculation in the aforementioned processing procedure is outputted as information about the final arrangement by the output device 5. The information about the final arrangement is shown, for example, in the form of a table as shown in FIG. 5B, and includes electric wire IDs, electric wire center positions, electric wire radii, and electric wire types. Furthermore, the center position and radius of the comprehensive circle are added to the information about the final arrangement. Although the electric wire IDs, electric wire radii, and electric wire types are similar to those in the initial arrangement diagram, the calculated center positions (x1', y1'), ..., (x7', y7'), ..., of the circles $C_i$'s, the calculated center position (X1, Y1) of the comprehensive circle C, and the calculated radius R1 of the comprehensive circle are displayed as the center positions of the electric wires, the center position of the comprehensive circle, and the radius of the comprehensive circle. Preferably, a final arrangement diagram as depicted in FIG. 6D is outputted as the information about the final arrangement. More preferably, electric wire IDs (not shown) corresponding to all the circles are added to the initial arrangement diagram and final arrangement diagram. It is possible to track the destination positions by outputting these kinds of information about the final arrangement and information about the initial arrangement. The electric wire IDs correspond to information for identifying wire materials.

The behavior of the circles caused by the above-described processing procedure is described with reference to FIGS. 6A-6D, which illustrate behavior caused by the processing procedure of FIG. 3. Especially, FIG. 6A shows the initial condition. FIG. 6B shows insertion-tried circles protruding from the target circle. FIG. 6C shows the manner in which the insertion-tried circles of FIG. 6B have been inserted in the target circle. FIG. 6D shows the final results.

In FIG. 6A, the initial arrangement of given n circles $C_i$'s and the comprehensive circle C surrounding them are shown. In FIG. 6A, circles $c_{11}$ and $c_{12}$ show a twisted wire that is one kind of composite wire, for example. In FIG. 6B, processing in progress is shown. There are shown the target circle D slightly smaller than the comprehensive circle C currently obtained and insertion-tried circle $C_n$ which is one of circles protruding from the target circle D and which is attempted to be inserted.

In FIG. 6C, there is shown the state obtained after the inserting processing of steps S7 and S8 shown in FIG. 3 is done on the insertion-tried circle $C_n$ shown in FIG. 6B. In FIG. 6C, circles $m_i$'s indicated by coarser hatched lines have been moved to insert the insertion-tried circle $C_n$ in the inserting processing. As can be seen from this diagram, other protruding circles may also enter the target circle D during the process for inserting the insertion-tried circle $C_n$. In FIG. 6D, results of processing for inserting all protruding circles are shown. With respect to the circles $c_{11}$ and $c_{12}$ corresponding to a composite wire, their mutual connective relationship is maintained throughout the processing.

In this way, the arrangement of circles corresponding to plural electric wires forming a wiring harness is changed such that they are moved as farther as possible from the circles corresponding to electric wires protruding from the comprehensive circle. The protruding electric wires are inserted into the space formed by the movement. Calculations for these operations are repetitively performed. Consequently, the outside diameter of the wiring harness surrounding the plural electric wires is efficiently found. Especially, with respect to each composite wire, circles corresponding to it are found to satisfy the mutual connective relationship, i.e., movement conditions. Hence, calculations for packing can be performed according to the actual circumstances.

Figure 8:
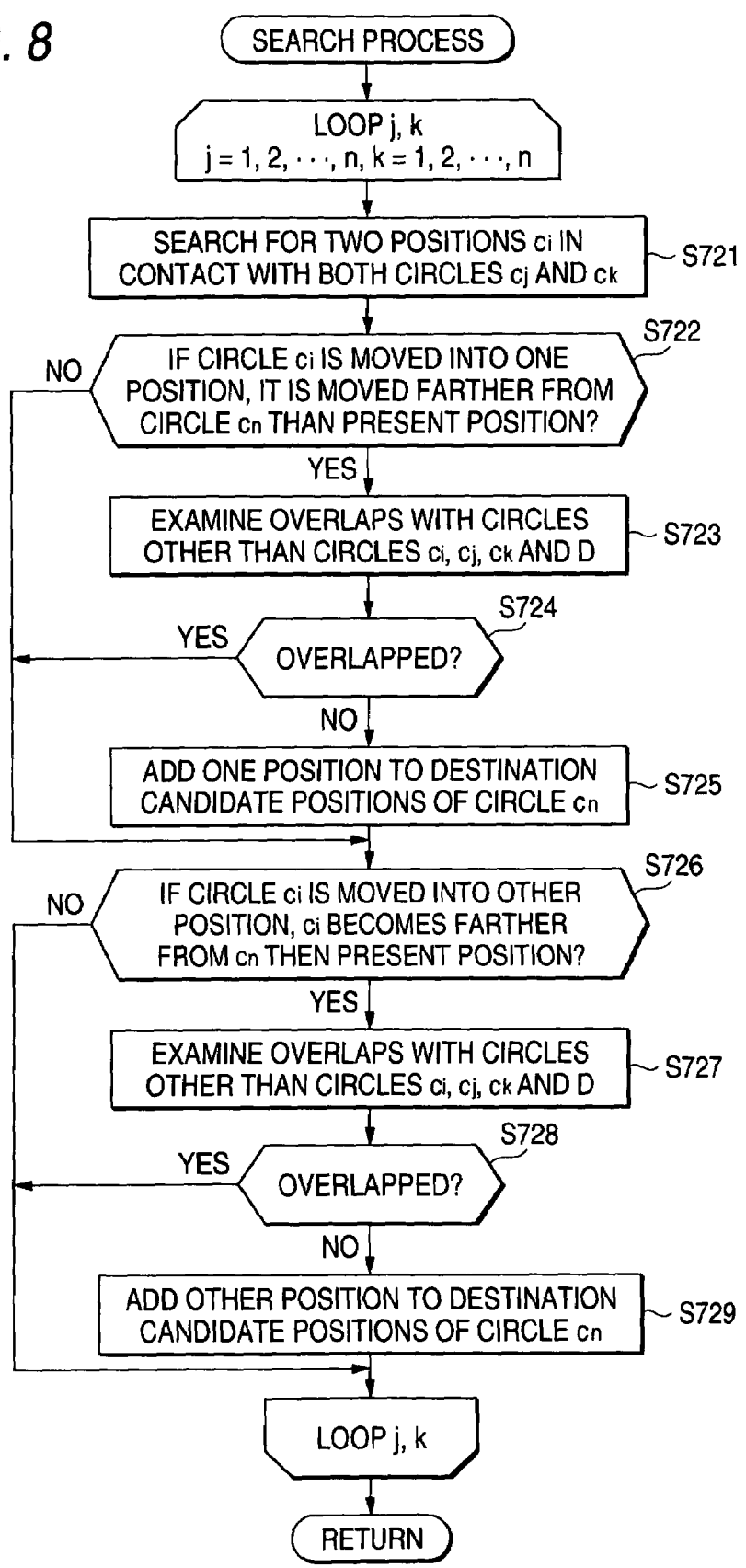
FIG. 8 is a flowchart illustrating processing for making a search, the processing being shown in FIG. 7.

The processing of step S7 of FIG. 3 to insert single wires is next described with reference to FIGS. 7 and 8. FIG. 7 is a flowchart illustrating the processing for inserting single wires in FIG. 3. FIG. 8 is a flowchart illustrating processing for making a search, the processing being shown in FIG. 7.

In the processing shown in FIG. 7 for inserting single wires, input information is given. The input information includes the radii $r_i$'s of n circles $c_i$'s, their centers $(x_i, y_i)$ (i=1, 2, ..., n), and target circle D. It is assumed that the n circles $c_i$'s do not overlap with each other and that the final circle $C_n$ protrudes from the target circle D. There may be other protruding circles.

If the final circle $C_n$ can be inserted into the target circle D without permitting circles already inserted in the target circle D to protrude from this target circle D, then it is determined that successful results have been obtained. The center positions of the n circles achieving this are outputted as output information. If such insertion cannot be performed, then it is determined that unsuccessful results have been obtained. A message to this effect is outputted.

First, in the processing of step S71 for search and insertion, the n circles $c_i$'s are rearranged in order from the circle farthest from the final circle $c_n$. This order is based on the distances from the centers of the n circles $c_i$'s to the center of the final circle $c_n$. Numbers given to the rearranged circles are now indicated by $c_1, c_2, ..., c_n$, respectively, for simplicity. The final circle is hereinafter referred to as the insertion-tried circle.

Then, processing shown in steps S72 to S74a (or step S74b) is performed for i=1, 2, ..., n−1. In step S72, processing for search is performed. That is, a search is made for a destination candidate position into which each circle $c_i$ can be moved without overlapping with other circles within the target circle D. Specifically, this processing for search includes first searching processing shown in FIG. 8 or second searching processing shown in FIG. 10. In the first searching processing, a search is made for a destination candidate position into which each circle $c_i$ is placed farther from the insertion-tried circle $c_n$ than the present position of the circle $c_i$ without overlapping with other circles within the target circle D. Furthermore, in the second searching processing shown in FIG. 10, a search is made for a destination candidate position into which each circle $C_i$ can be moved within the target circle D without overlapping with other circles, using the concept of the Voronoi diagram on a circle. These will be described later.

In steps S73, S74a, and S74b, if destination candidate positions are found in the above-described processing for search, the circle $c_i$ is moved to that of the destination candidate positions which is farthest from the insertion-tried circle $c_n$ (affirmative (YES) decision in step S73 and step S74a). If no destination candidate position is found, the circle $c_i$ is left in the present position (negative (NO) decision in step S73 and step S74b). These processing steps are performed for i=1, 2, . . . , n−1. Then, the program goes to step S75. The steps S72-S74 correspond to the searching step recited in claims of the present application.

Next, in step S75, the insertion-tried circle $c_n$ is attempted to be inserted into the space within the target circle D formed by the loop processing consisting of the steps S72 to S74a (or step S74b).

In steps S76, S77a, and S77b, if the attempt of the insertion is made successfully, the insertion-tried circle $c_n$ is moved thereto (affirmative (YES) decision in step S76 and step S77a). If the attempt has failed, a message to the effect is outputted (negative (NO) decision in step S76 and step S77b). If the attempt has succeeded, the center positions of n circles for realizing it are outputted. After end of the sequence of processing steps consisting of steps S71 to S77a (or step S77b), the program returns to the subsequent processing shown in FIG. 6.

In the search processing illustrated in FIG. 8, if there is a space permitting movement of n circles $c_i$'s, it is noticed that each circle $c_i$ should be in contact with two circles under the condition where the circle has moved as farther as possible from the insertion-tried circle $C_n$. Notice that one of these two contacting circles is the target circle D in some cases. Accordingly, a set of the given n circles $c_i$'s and the target circle D is indicated by $S=\{c_1, c_2, \ldots, C_n, D\}$. Processing illustrated in the following steps S721-S729 is performed for all the two circles $c_j$ and $C_k \in S$ other than the circles $c_i$'s.

First, in step S721, a search is made for any location where the circle $c_i$ of radius $r_i$ is in contact with both circles $c_j$ and $c_k$. It is assumed that if the circle $c_j$ or $c_k$ is a circle other than the target circle D, the circle $c_i$ makes a contact from the outside and that if the circle $c_j$ or $c_k$ is the target circle D, the circle $c_i$ makes a contact from the inside. There are two such locations at maximum. In this case, the centers are respectively given by $(x'_i, y'_i)$ and $(x''_i, y''_i)$.

Next, in step S722, if movement into one of the two positions is made, a decision is made as to whether the circle $c_i$ becomes farther from the insertion-tried circle $c_n$ than the present position. That is, the distance X' from one center $(x'_i, y'_i)$ to the center of the insertion-tried circle $c_n$ and the distance X from the center of the circle $c_i$ in the present position to the center of the insertion-tried circle $c_n$ are compared. If the distance X' is greater than the distance X, the program goes to step S723 (affirmative (YES) decision in step S722); otherwise, the program proceeds to step S726 (described later) (negative (NO) decision in step S722).

In step S723, a decision is made for all the circles other than the circles $c_i$, $c_j$, $c_k$, and target circle D as to whether there is an overlap when the circle $c_i$ of radius $r_i$ is placed in the center $(x_i, y_i)$. This decision on the overlap is made in step S724. If the decision is that there is no overlap with any other circle, the program goes to step S725 (negative decision in step S724). In step S725, the center $(x_i', y_i')$ is added to movement candidate positions of the circle $c_i$. Otherwise, the program proceeds to step S726 (affirmative (YES) decision in step S724).

Furthermore, the above-described one center $(x_i', y_i')$ is replaced by the other center $(x_i'', y_i'')$, and processing of the following steps S726-S729 is performed in the same way as the aforementioned steps S722-S725. In step S726, a decision is made as to whether the circle $c_i$ becomes farther from the inserted-tried circle $c_n$ than the present position if movement into the other of the two positions is made. That is, the distance X" from the other center $(x_i'', y_i'')$ to the center of the insertion-tried circle $c_n$ and the distance X from the center of the circle $c_i$ in the present position to the center of the insertion-tried circle $c_n$ are compared. If the distance X" is greater than the distance X, the program goes to step S727 (affirmative (YES) decision in the step S726). Otherwise, the program goes directly to the next step (negative (NO) decision in step S726).

In step S727, a decision is made for all the circles other than the circles $c_i$, $c_j$, $c_k$, and the target circle D as to whether there is an overlap when the circle $c_i$ of radius $r_i$ is placed in the center $(x_i'', y_i'')$. This decision on the overlap is made in step S728. If the decision is that there is no overlap with any other circle, the program goes to step S729 (negative decision in step S728). In step S729, the center $(x_i'', y_i'')$ is added to destination candidate positions of the circle $c_i$. Otherwise, the program proceeds directly to the next step (affirmative (YES) decision in step S728). If this processing is performed for all the two circles $c_j$ and $c_k$ other than the circle $c_i$, the program returns to the subsequent processing illustrated in FIG. 8.

Figure 9:
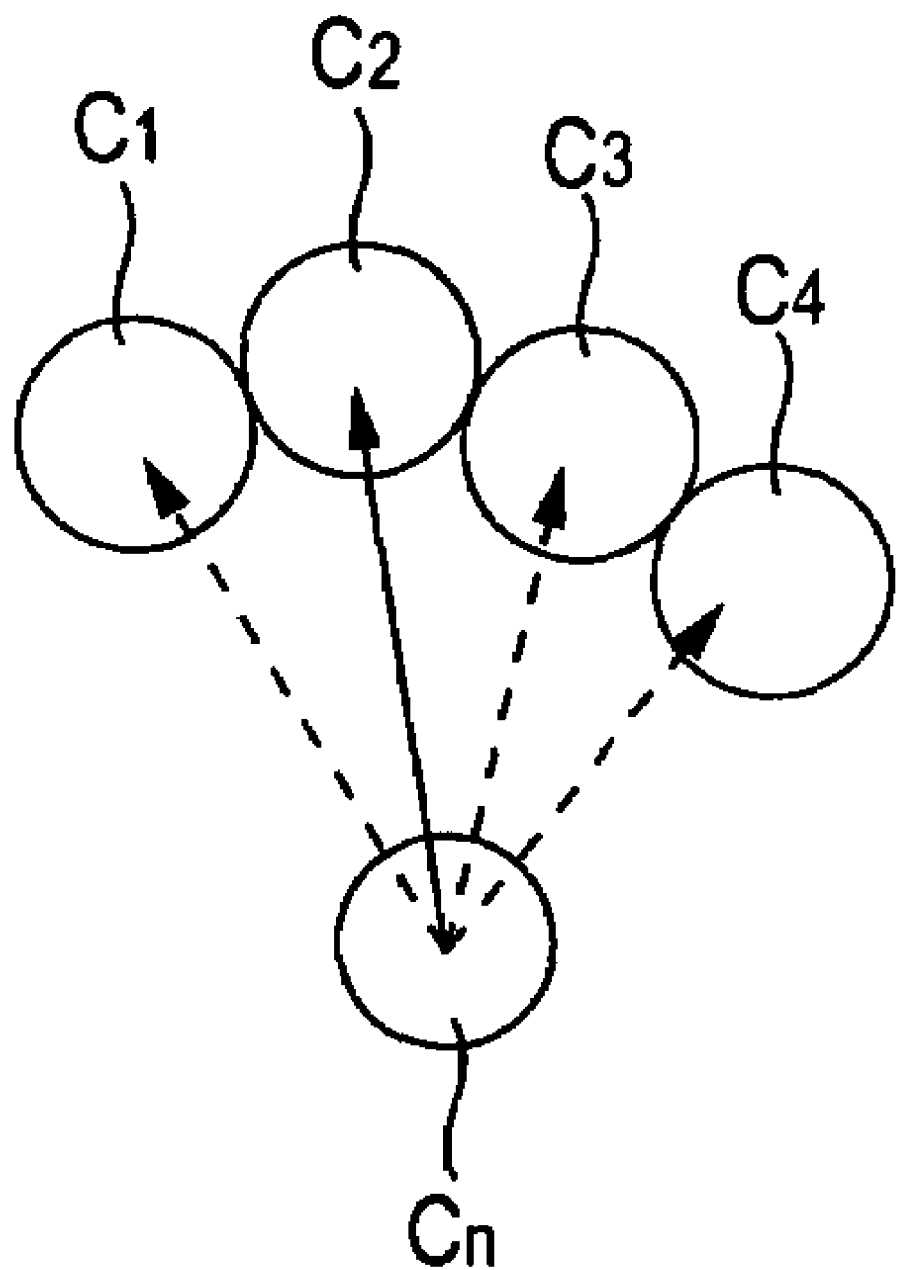
FIG. 9 illustrates a method of moving circles corresponding to a composite wire.

Then, processing of step S8 of FIG. 3 for inserting a composite wire is described with reference to FIGS. 9-18. Before the processing procedure of the processing for inserting a composite wire is described in detail, the fundamental procedure is described by referring to FIGS. 9-11. FIG. 9 illustrates a method of moving circles corresponding to a composite wire. FIGS. 10 and 11 show an example of processing recognized as insertion of a composite wire and an example of processing not recognized as insertion of a composite wire, respectively.

The processing for inserting a composite wire is performed in accordance with the following fundamental procedure.

Figure 10A:
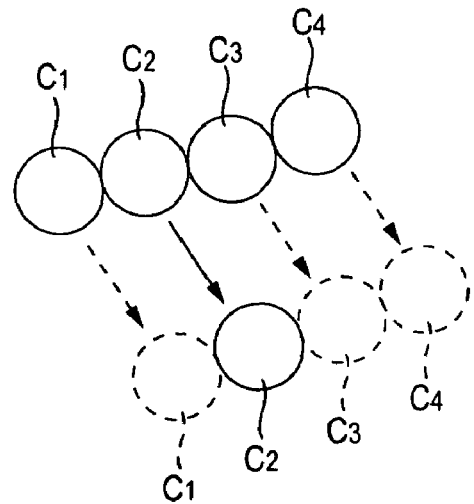
FIGS. 10A-10C show examples of processing recognized as processing for inserting composite wires.
Figure 10B:
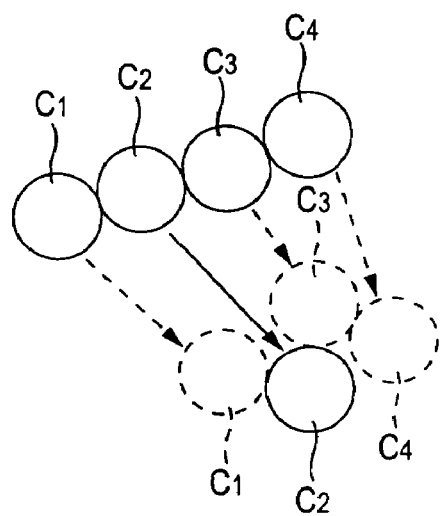
Figure 10C:
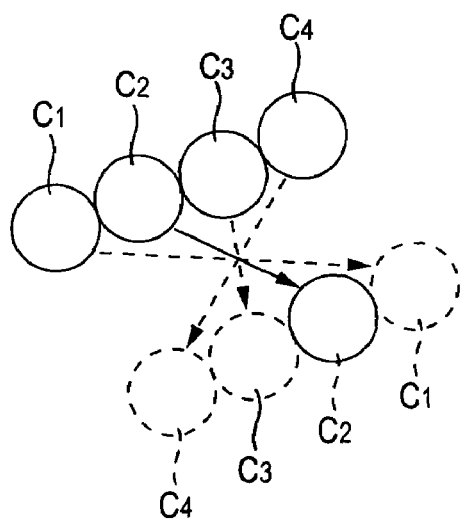
Figure 11A:
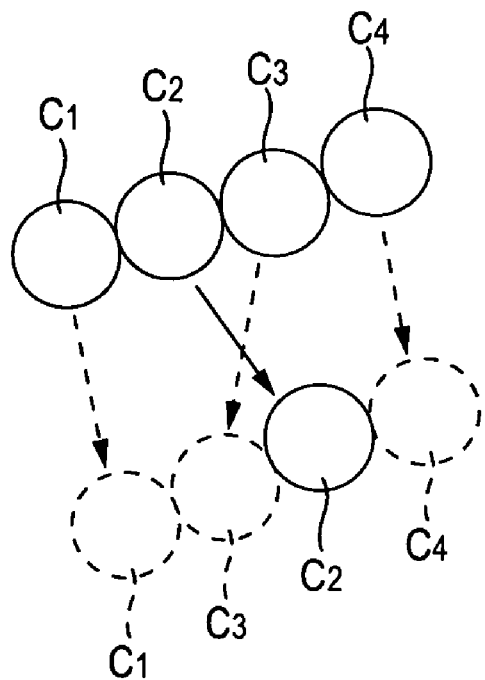
FIGS. 11A and 11B show examples of processing not recognized as processing for inserting composite wires.
Figure 11B:
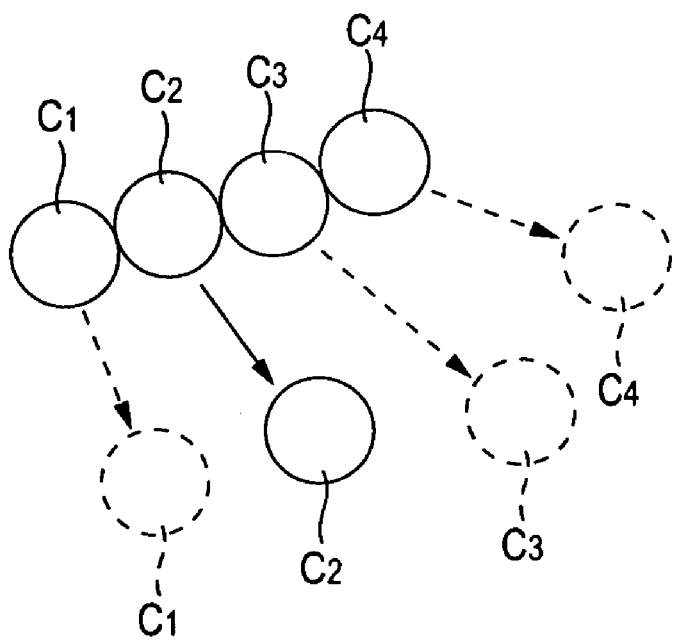

1. A comprehensive circle containing circles corresponding to all electric wires initially placed is set.
2. A target circle that becomes smaller than the comprehensive circle with given control variables is set.
3. An operation for inserting circles (insertion-tried circles) protruding from the target circle into the target circle is performed.
   (i) As shown in FIG. 9, all the circles are moved farther from the insertion-tried circle $c_n$ within the range of the target circle in order of reducing distance from the insertion-tried circle, i.e., in the order—circles $c_1$, $c_2$, $c_3$, and $c_4$.
   (ii) Where a moved circle belongs to a composite wire, the other circles within the composite wire must be moved while maintaining the connective relationship. Therefore, circles within the same composite wire are thereafter moved preferentially. After end of processing. of all the circles within the composite wire, processing of the next circle is performed. As shown in FIGS. 10A-10C, if the connective relationship between the circles $c_1$-$c_4$ corresponding to the composite wire is maintained, variation of shape is allowed. However, as shown in FIGS. 11A and 11B, the connective relationship between the circles $c_1$-$c_4$ corresponding to the composite wire is not permitted to vary.
   (iii) When insertion can no longer be performed, the size of the comprehensive circle is sent back, and then the processing is terminated normally.
4. If the insertion is done successfully, the processing is repeated from 2 above.

The processing of 1-3(i) above is common with the aforementioned processing for inserting single wires. The above-described 3(ii) shows processing intrinsic to the processing for inserting composite wires. This will be described below with reference to the flowchart of FIG. 12, which is a flowchart illustrating a processing procedure associated with the processing for inserting composite wires.

Figure 12:
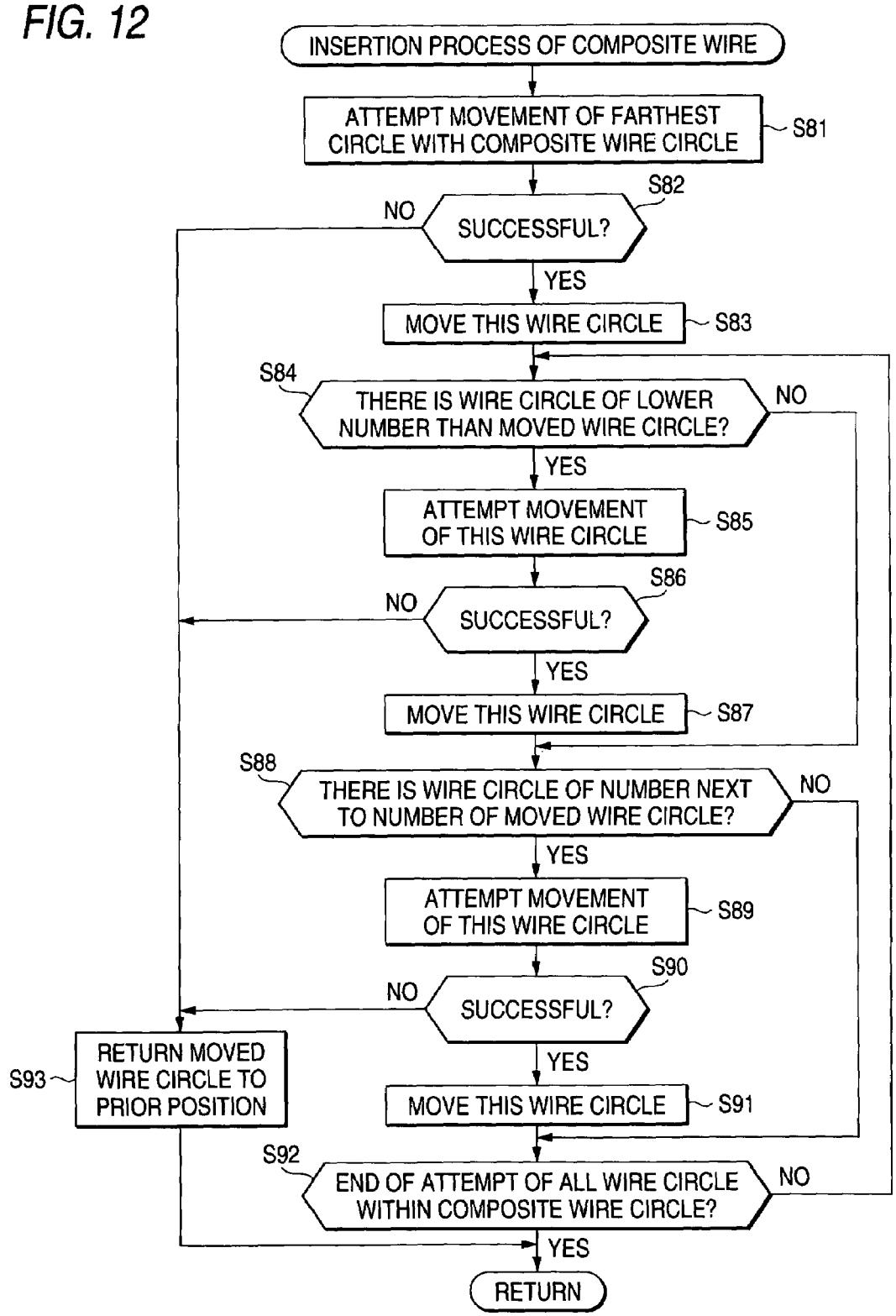
FIG. 12 is a flowchart illustrating a processing procedure associated with processing for inserting composite wires.

In steps S81-S83 of FIG. 12, movement of a circle (referred to also as an electric wire circle) corresponding to the electric wire at the greatest distance from the insertion-tried circle such as circle $c_1$ of FIG. 9 within circles (referred to also as composite wire circles) corresponding to composite wires is attempted (step S81). In this attempted movement, the rule of 3(i) above is applied. Complementarily speaking, in this embodiment, the position at which the moved electric wire circle makes a contact is found from a combination of the electric wire circle moved immediately before and two circles corresponding to all the other electric wires. Among them, the position which does not overlap with any other electric wire circle and which is at the greatest distance from the insertion-tried circle is taken as a trial destination. The order of trial movements does not always correspond to the order of electric wire IDs. However, a set of circles corresponding to a composite wire needs to be processed continuously. If the movement is made successfully (affirmative (YES) decision in step S82), the electric wire circle is moved into the trial destination position (step S83). However, if the movement is made unsuccessfully (negative (NO) decision in step S82), the sequence of processing is ended. In this embodiment, since any electric wire circle has not been moved, the processing is simply ended without carrying out the processing of step S93.

Then, in steps S84-S87, if there is an electric wire circle which is in contact with the electric wire that has moved immediately before and which has the immediately preceding number (affirmative (YES) decision in step S84), movement of this electric wire circle is attempted (step S85). If the movement is made successfully (affirmative (YES) decision in step S86), the electric wire circle is moved into the trial position (step S87). If the movement is made unsuccessfully (negative decision in step S86), the moved electric wire circle is returned to the position taken before the movement, and the sequence of processing is ended (step S93). If there is not any electric wire circle which is in contact with the electric wire that has moved immediately before and which has the immediately preceding number (negative (NO) decision in step S84), it is determined that the end circle has been moved. Steps S88-S91 are repeated.

Then, in steps S88-S91, if there is an electric wire circle which is in contact with the electric wire that has moved immediately before and which has the next number (affirmative (YES) decision in step S88), movement of this electric wire circle is attempted (step S89). If the movement is made successfully (affirmative (YES) decision in step S90), the electric wire circle is moved into the attempted position (step S91). If the movement is done unsuccessfully (negative (NO) decision in step S90), the moved electric wire circle is returned to the position taken before the movement. The sequence of processing is ended (step S93). If there is not any electric wire circle which is in contact with the electric wire that has moved immediately before and which has the next number (negative (NO) decision in step S88), it is determined that the end circle has moved. The program goes through step S92. Then, steps S84-S87 are repeated.

This processing is attempted for all the circles which make a set and which correspond to the composite wire (step S92).

Figure 13:
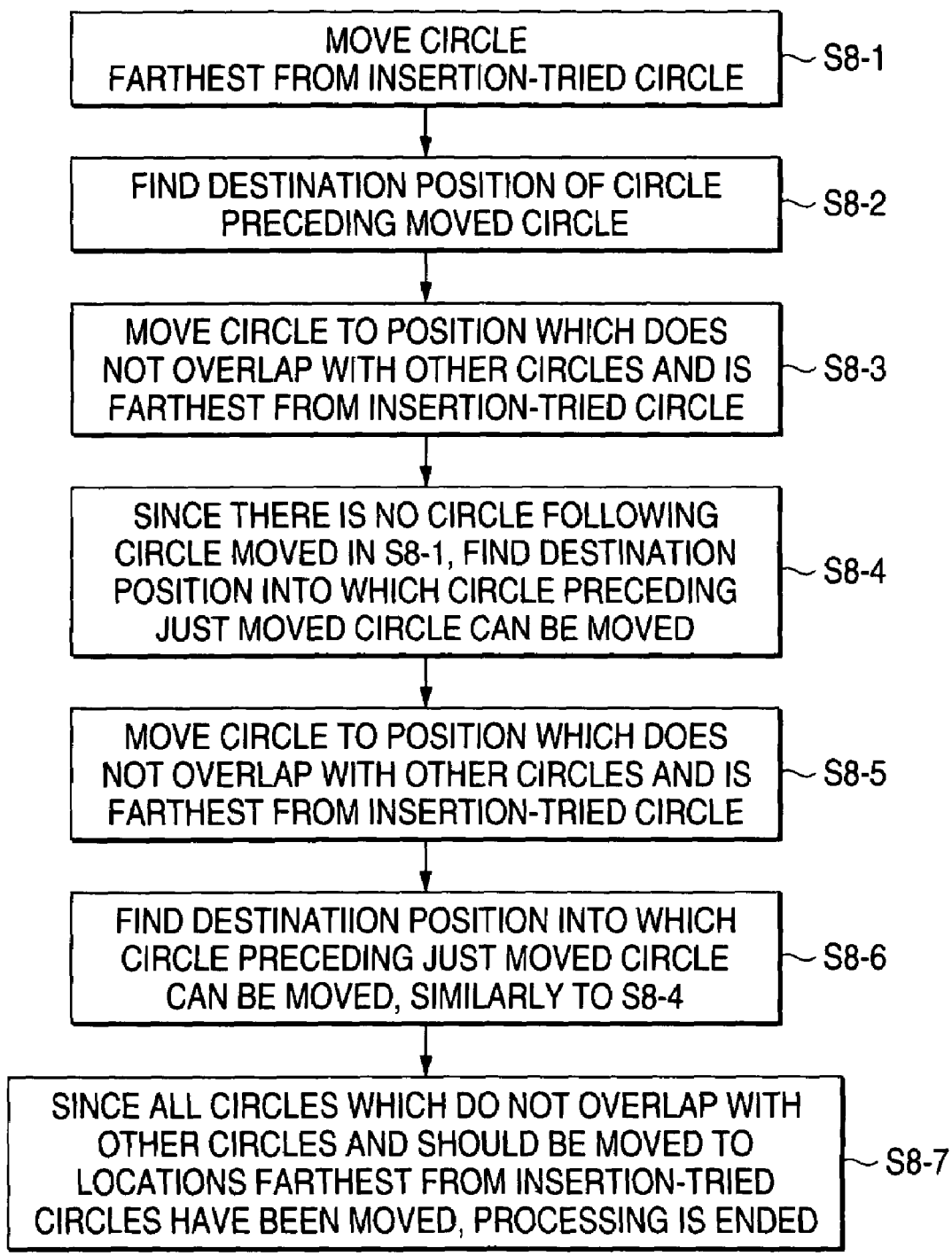
FIG. 13 is a flowchart illustrating the flow of processing in a case where movement is made from an end circle.

This processing procedure is described in detail with reference to FIGS. 13-15 and 16-18. FIGS. 13-15 particularly illustrate an example in which movement is made from the end circle. That is, FIG. 13 illustrates the flow of processing in a case where movement is made from the end circle. FIGS. 14A-14D and FIGS. 15A-15C illustrate the behavior of each circle after each phase of processing in FIG. 13.

Figure 17A:
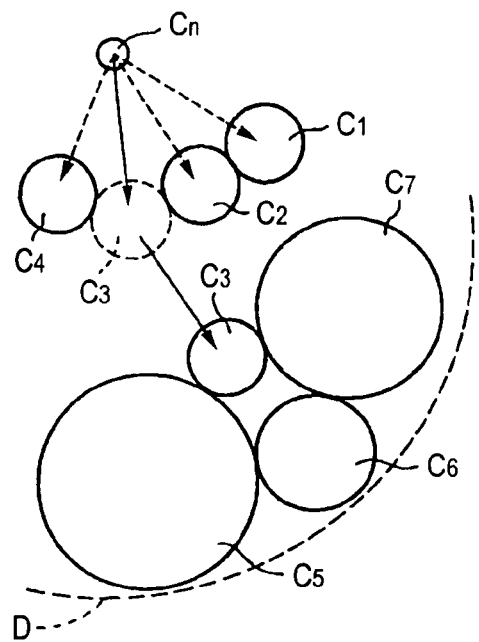
FIGS. 17A-17D illustrate the behavior of each circle after each phase of processing in FIG. 16.
Figure 17B:
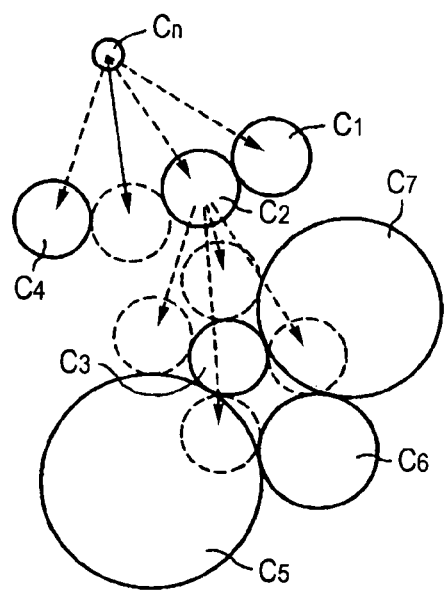
Figure 17C:
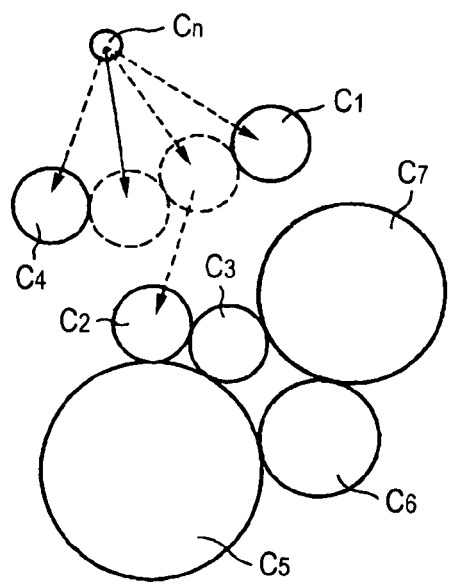
Figure 17D:
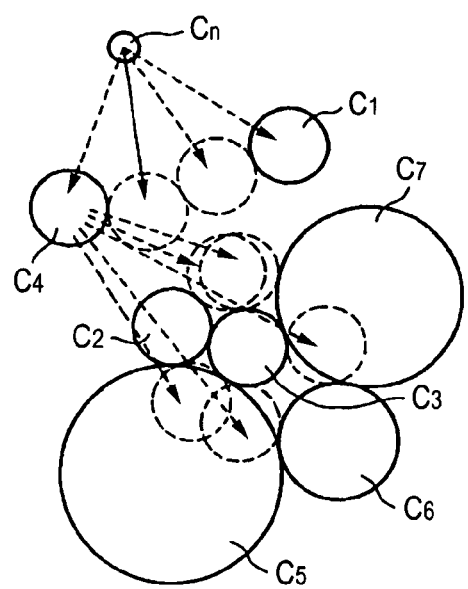
Figure 18A:
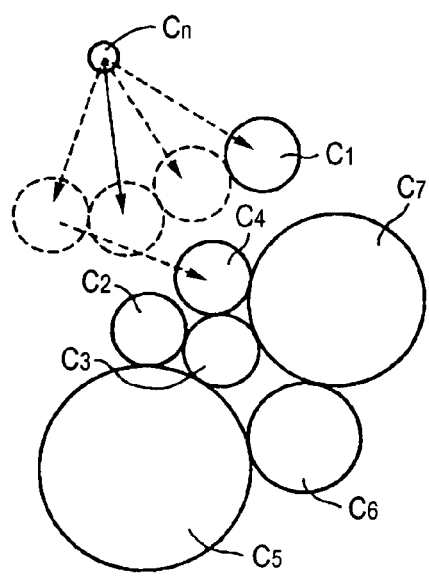
FIGS. 18A-18C illustrate the behavior of each circle after each phase of processing in FIG. 16.
Figure 18B:
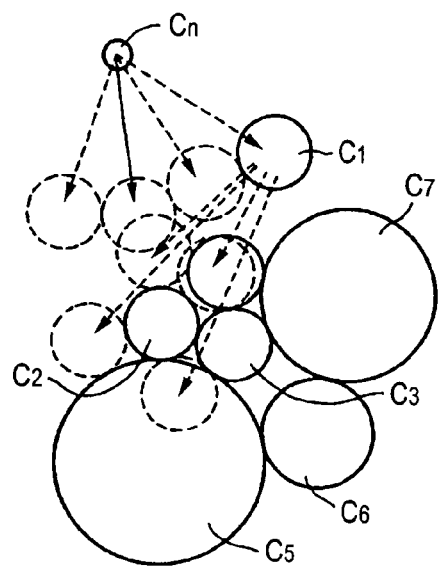
Figure 18C:
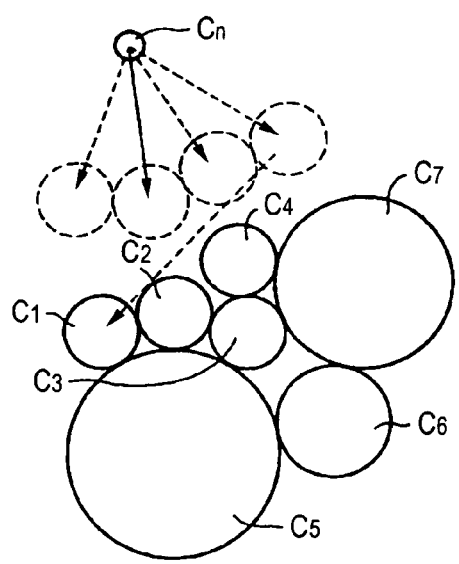

FIGS. 16-18 particularly illustrate examples in which movement is made from other than the end circle. In particular, FIG. 16 illustrates the flow of processing in a case where movement is made from other than the end circle. FIGS. 17A-17D and FIGS. 18E-18C illustrate the behavior of each circle after each phase of processing in FIG. 16.

In the figures, $c_n$ indicates an attempted circle. $c_1$, $c_2$, $c_3$, and $c_4$ indicate circles corresponding to a composite wire such as flat wire 9. $c_5$, $c_6$, and $c_7$ indicate circles corresponding to a single wire. D indicates a target circle. In this case, all the circles corresponding to the composite wire are movable.

Figure 14A:
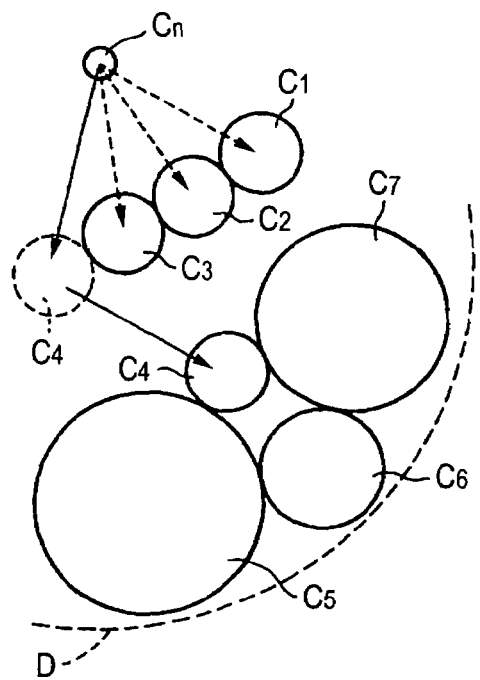
FIGS. 14A-14D illustrate the behavior of each circle after each phase of processing in FIG. 13.
Figure 14B:
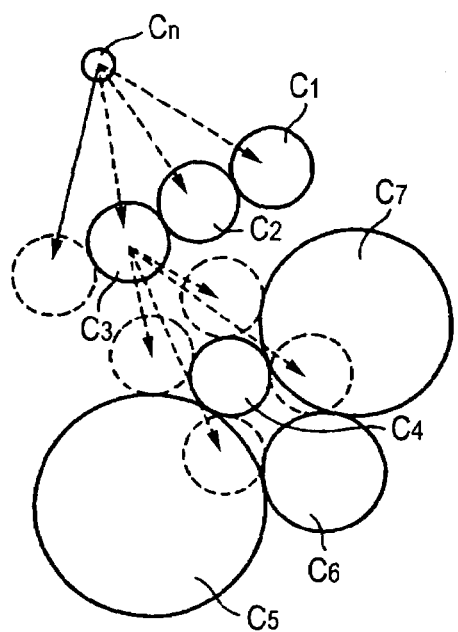
Figure 14C:
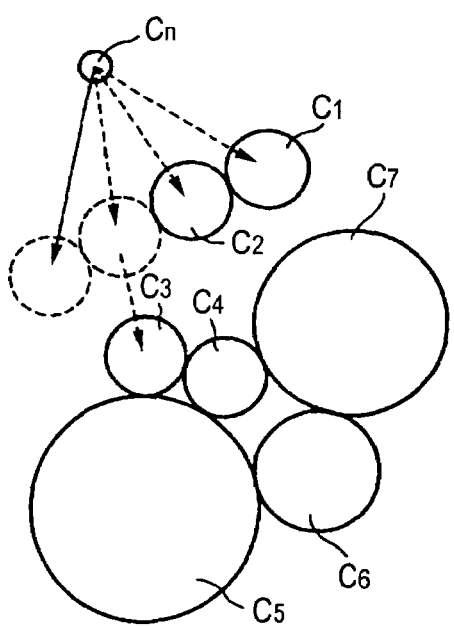
Figure 14D:
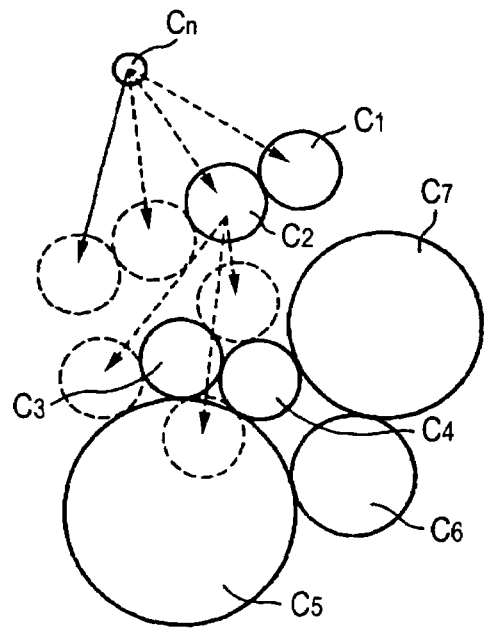
Figure 15A:
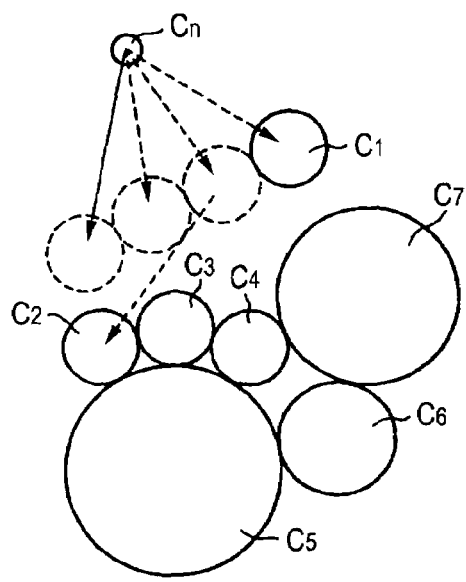
FIGS. 15A-15C illustrate the behavior of each circle after each phase of processing in FIG. 13.
Figure 15B:
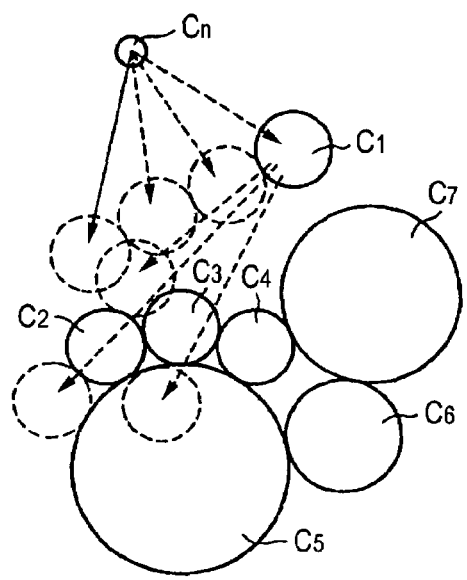
Figure 15C:
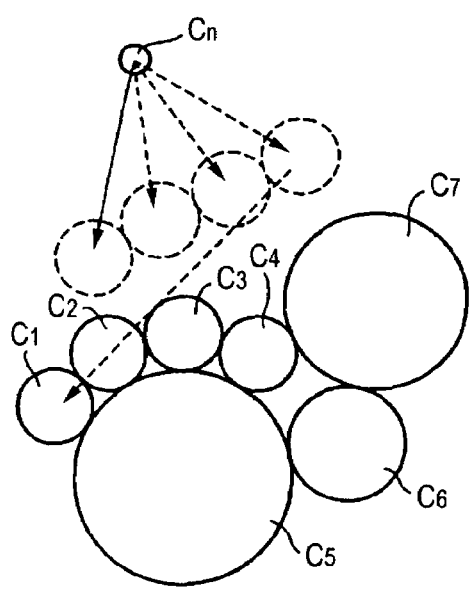

In FIGS. 13-15, in a case where movement is made from the end circle (circle $C_4$), the circle $C_4$ farthest from the insertion-tried circle $c_n$ is first moved (step S8-1) as shown in FIG. 14A. Then, as shown in FIG. 14B, a destination position into which the circle $c_3$ having a number immediately preceding the number given to the moved circle $c_4$ is found (step S8-2). Thereafter, as shown in FIG. 14C, the circle $c_3$ is moved into a position in which the circle does not overlap with any other circle and which is at the greatest distance from the insertion-tried circle $c_n$ (step S8-3). Then, as shown in FIG. 14D, there is not any circle having a number following the number given to the circle $c_4$ moved in the step S8-1 and so a destination position into which the circle $c_2$ having a number immediately preceding the number given to the just moved circle $c_3$ can be moved is found (step S8-4).

Furthermore, as shown in FIG. 15A, the circle $c_2$ is moved into a position in which the circle does not overlap with any other circle and which is farthest from the insertion-tried circle $c_n$ (step S8-5). Then, as shown in FIG. 15B, a destination position into which the circle $c_1$ having a number immediately preceding the number given to the just moved circle $c_2$ can be found, in the same way as in the step S8-4. As shown in FIG. 15C, the circle $c_1$ is moved into a position in which the circle does not overlap with any other circle and which is farthest from the insertion-tried circle $c_n$ (step S8-7). In this way, all the circles corresponding to the composite wire have moved and thus the processing is ended.

In FIGS. 16-18, in a case where movement is made from other than the end circle (circle $c_3$), the circle $c_3$ farthest from the insertion-tried circle $c_n$ is first moved as shown in FIG. 17A (step S8-1'). Then, as shown in FIG. 17B, a destination position into which the circle $c_2$ having a number immediately lower than the number given to the moved circle $c_3$ can be moved is found (step S8-2'). Then, as shown in FIG. 17C, the circle $c_2$ is moved into a position in which the circle does not overlap with any other circle and which is farthest from the insertion-tried cycle $c_n$ (step S8-3'). Subsequently, as shown in FIG. 17D, a destination position into which the circle $c_4$ having a number following the number given to the circle $c_3$ moved in step S8-1 can be moved is found (step S8-4').

Furthermore, as shown in FIG. 18A, the circle $c_4$ is moved into a position in which the circle does not overlap with any other circle and which is farthest from the insertion-tried circle $c_n$ (step S8-5'). Then, as shown in FIG. 18B, a destination position into which the circle $c_1$ having a number immediately preceding the number given to the circle $c_2$ moved in step S8-3' can be moved is found (step S86'). Then, as shown in FIG. 18C, the circle $c_1$ is moved into a position in which the circle does not overlap with any other circle and which is farthest from the insertion-tried circle $c_n$ as shown in FIG. 18C (step S8-7'). In this way, all the circles corresponding to the composite wire have moved. The processing is ended.

By finding the comprehensive circle by the procedure described so far, plural electric wires can be packed efficiently and compactly. Especially, the comprehensive circle is found in such a way as to satisfy the conditions in which the electric wires are respectively moved. Therefore, calculations for packing can be performed according to the actual circumstances. For example, calculations for packing of electric wires including twisted wires or flat wires are made possible.

In the above embodiment, all the electric wires forming a composite wire are uniform in thickness. The composite wire may include electric wires of different thicknesses. Obviously, the composite wire is not limited to a twisted wire or flat wire. Furthermore, in the above embodiment, the radius of the comprehensive circle is outputted to find the outside diameter. It is obvious that the radius can be replaced by the diameter. In addition, the values of ρ and the end reference value used in the calculation of the comprehensive circle are not limited to the values shown in the above embodiment. They may be appropriately modified within the gist of the present invention.

Figure 19:
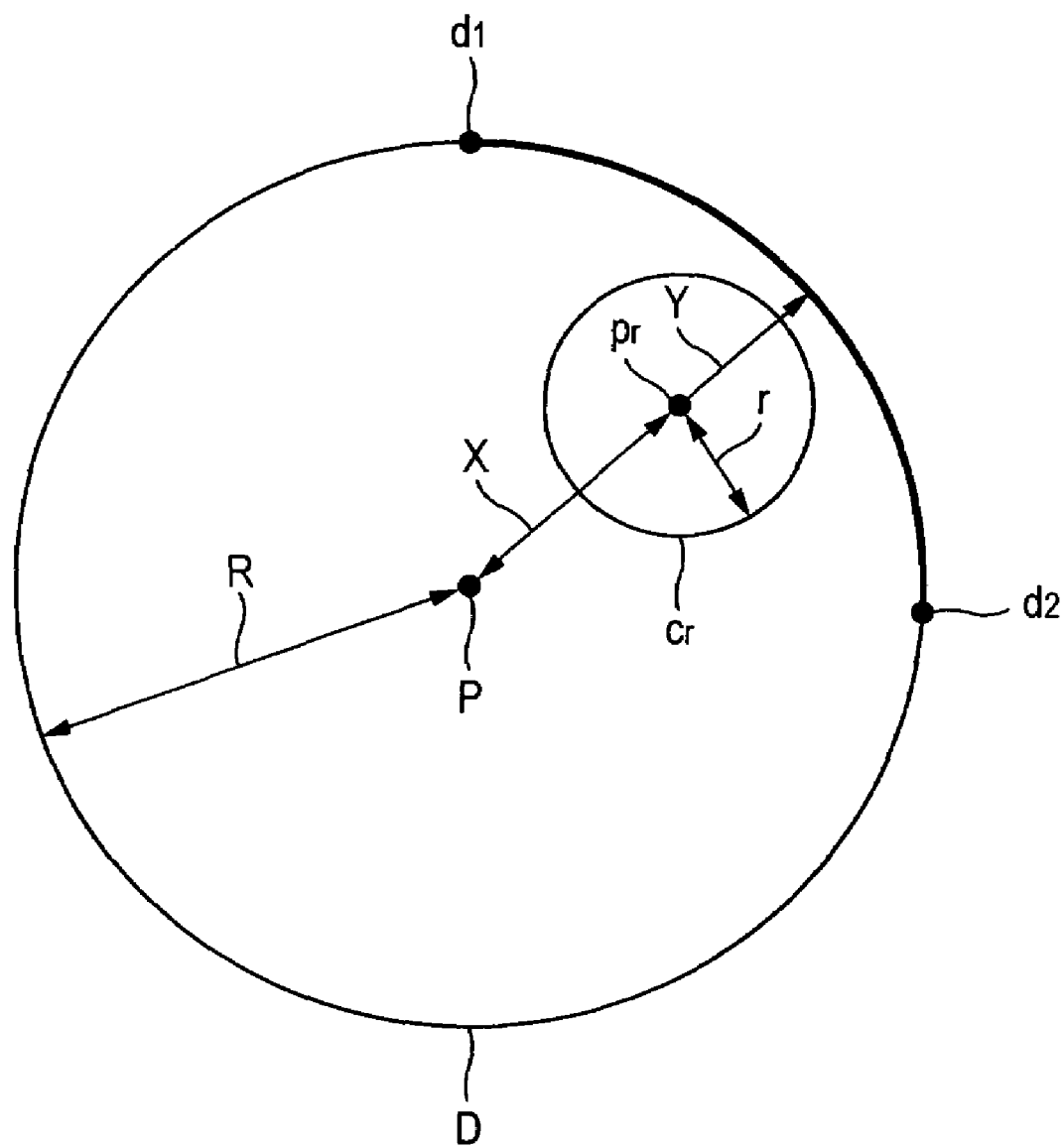
FIG. 19 is a diagram illustrating another embodiment of the present invention.

In the above-described embodiment, the conditions under which the circles are moved are established assuming a composite wire. The scope of application of the present invention can be extended by establishing other conditions as the movement conditions. FIG. 19 illustrates another embodiment of the present invention.

In FIG. 19, $c_r$ indicates a circle corresponding to a wire material that should be placed in the outermost location out of plural wire materials to be packed. The circle $c_r$ corresponds, for example, to the thickest wire material of the plural wire materials. This may also be the second or third thickest wire material. D indicates the comprehensive circle of the plural wire materials to be packed as mentioned previously.

The thick wire material is placed on the outside to create stricter conditions assuming the worst case in bending endurance tests of wiring harnesses placed within automobiles. Specifically, the portion of a wiring harness having the shortest life is a part bent and displaced repetitively such as in an automobile door that is opened and closed. Especially, where a thick wire material is placed inside the bent portion (i.e., outer portion in the cross section of the wiring harness), the wiring harness often suffers from the shortest life. Consequently, this case is assumed.

In this embodiment, conditions under which wire materials are packed such that the circle $c_r$ is placed as outermost as possible are included in the movement conditions. The conditions may be set assuming that the circle $c_r$ makes a complete contact with the comprehensive circle D. Additionally, the conditions may be set assuming that the circle can be regarded to be in contact, though it, strictly speaking, does not make a contact.

For example, where the conditions are established assuming that the circle $c_r$ makes a complete contact with the comprehensive circle D, the following formula Y1 used to make a decision on contact is established:

$$Y1 = R - X = r$$

where R is the radius of the comprehensive circle D, r is the radius of the circle $c_r$, and X is the distance between the center P of the comprehensive circle D and the center $p_r$ of the circle $c_r$.

Calculations for packing are carried out to satisfy the decision formula Y1 on contact. That is, in this case, the processing procedure illustrated in the above-described first embodiment can be applied correspondingly. In step S6' replacing the step S6 of FIG. 3, a decision is made as to whether the above-described decision formula Y1 is used or not. Where the decision formula Y1 is used, calculations for packing are performed to satisfy the relation given by the decision formula Y1 in the following step S8' replacing step S8. To make efficient the calculations for packing, the circle $c_r$ is initially placed so as to satisfy the decision formula Y1. Using this as a starting point, the calculations for packing are preferably carried out to satisfy the decision formula Y1.

Consequently, it is assured that packed arrangement of wire materials necessary for bending tests, for example, is obtained. Furthermore, as shown in FIG. 19, a wire material arrangement better complying with actual circumstances can be obtained by stipulating a contact range d1-d2 on the comprehensive circle D in the decision formula Y1.

For example, where setting is done assuming that the circle $c_r$ makes a complete or nearly complete contact with the comprehensive circle D, the following decision formula Y2 on contact is established:

$$r \leq Y2 = R - X \leq r + (r \times 0.1)$$

where R is the radius of the comprehensive circle D, r is the radius of the circle $c_r$, and X is the distance between the center P of the comprehensive circle D and the center $p_r$ of the circle $c_r$.

The term "r×0.1" in the decision formula Y2 permits generation of a gap between the center P of the comprehensive circle D and the circle $c_r$, the gap being small enough that circles corresponding to other circles do not enter the gap. The term "r×0.1" stipulates that the circle $c_r$ makes a contact with the comprehensive circle D. Instead of the term "r×0.1", the value of the diameter of the thinnest one of plural wire materials may be used.

Calculations for packing are carried out to satisfy the decision formula Y2 on contact. That is, the processing procedure illustrated in the first embodiment can be correspondingly applied also to this case. In step S6" replacing the step S6 of FIG. 3, a decision is made as to whether the decision formula Y2 is used or not. Where the decision formula Y2 is used, calculations for packing are performed to satisfy the relation given by the decision formula Y2 in the following step S8" replacing S8. To make efficient the calculations for packing, the circle $c_r$ is initially placed so as to satisfy the decision formula Y2. Preferably, using this as a starting point, the calculations for packing are performed to satisfy the decision formula Y2.

Consequently, it is assured that an arrangement of wire materials better complying with actual circumstances and necessary for bending tests, for example, is obtained. Furthermore, as shown in FIG. 19, a wire material arrangement better complying with actual circumstances can be found by adding conditions corresponding to a contact range d1-d2 on the comprehensive circle D to the decision formula Y2.

The present invention embracing the aforementioned embodiments can be similarly applied to a wiring harness placed indoors, as well as to a wiring harness placed within a vehicle.

A computer-readable record medium recording the above-mentioned program is also within the scope of the invention. Further, if the above-mentioned program is implemented by a program of the OS, etc., operating in a computer system, the record medium recording a program containing various instructions for controlling the program of the OS, etc., is also within the scope of the invention.

The present application is based on Japan Patent Application No. 2004-041641 filed on Feb. 18, 2004, the contents of which are incorporated herein for reference.

What is claimed is:

1. A computer implemented calculation method for packing a plurality of electric wire materials forming a wiring harness as compactly as possible, comprising the steps of:

setting a moving condition, using a processor of said computer, with respect to the respective electric wire materials;

regarding cross-sectional shapes of the plurality of electric wire materials as a plurality of circles having diameters corresponding to contours of the cross-sectional shapes;

assuming a comprehensive circle containing the plurality of circles which are arranged on a flat plane without overlapping with each other;

defining a target circle which is slightly smaller than the comprehensive circle and has the same center as the comprehensive circle such that at least one of the plurality of circles deviates from the target circle;

searching for a destination position into which the circles excluding an insertion-tried circle is moved as far as possible from the insertion-tried circle within the target circle without overlapping with each other, a circle among the at least one of the plurality of circles deviated from the target circle being regard as the insertion-tried circle;

inserting the insertion-tried circle into a space within the target circle, the space being formed by rearranging the plurality of circles such that circles respectively corresponding to the electric wire materials satisfy the moving condition, based on a result of the step of searching for the destination position;

defining a new target circle that is slightly smaller than the target circle and that contains the insertion-tried circle in a case that an entire portion of the insertion-tried circle is inserted in the target circle, regarding the target circle as the comprehensive circle and regarding the new target circle as the target circle;

repetitively performing the step of searching for the destination position, the step of inserting the insertion-tried circle, and the step of defining the new target circle for reducing the comprehensive circle;

in a case that insertion of the insertion-tried circle is impossible to achieve, determining information about positions of the comprehensive circle and the plurality of circles; and storing the determined information, wherein in the step of setting the moving condition, the moving condition has a connective relationship of certain electric wire materials corresponding to a composite wire in a case that the plurality of the electric wire materials include the composite wire configured by the certain electric wire materials, and wherein in a case that the composite wire is included in the electric wire materials as the moving condition, in the step of inserting the insertion-tried circle and the step of searching for the destination position, the certain circles corresponding to the composite wire are respectively moved in accordance with the connective relationship corresponding to the composite wire and the whole composite wire is moved only when all the certain circles corresponding to the composite wire are movable.

2. The computer implemented calculation method as set forth in claim 1, wherein input information for identifying the plurality of electric wire materials is previously assigned to the plurality of circles corresponding to the electric wire materials; and wherein the input information is outputted at least one of the timings of before start and after end of the calculation for the packing.

3. An apparatus having a processor that calculates information for packing a plurality of electric wire materials forming a wire harness as compactly as possible, the apparatus comprising:

a setting unit, which sets a moving condition with respect to the respective electric wire materials;

a cross-sectional shape regarding unit, which regards cross-sectional shapes of the plurality of electric wire materials as a plurality of circles having diameters corresponding to contours of the cross-sectional shapes;

a comprehensive circle-assuming unit, which assumes a comprehensive circle containing the plurality of circles which are arranged on a flat plane without overlapping with each other;

a target circle-defining unit, which defines a target circle which is slightly smaller than the comprehensive circle and has the same center as the comprehensive circle such that at least one of the plurality of circles deviates from the target circle;

a search unit, which searches for a destination position into which the circles excluding an insertion-tried circle is moved as far as possible from the insertion-tried circle within the target circle without overlapping with each other, a circle among the at least one of the plurality of circles deviated from the target circle being regard as the insertion-tried circle;

an insertion unit, which inserts the insertion-tried circle into a space within the target circle, the space being formed by rearranging the plurality of circles such that circles respectively corresponding to the electric wire materials satisfy the moving condition, based on a result of the step of searching for the destination position; and a search control unit, which defines a new target circle that is slightly smaller than the target circle and that contains the insertion-tried circle in a case where an entire portion of the insertion-tried circle is inserted in the target circle, regarding the target circle as the comprehensive circle and regarding the new target circle as the target circle, wherein the processings of the search unit, the insertion unit, and the search control unit are repetitively performed until insertion of the insertion-tried circle is impossible to achieve, wherein information about positions of the comprehensive circle and the plurality of circles are determined and stored in a case that the insertion of the insertion-tried circles is impossible to achieve, wherein the moving condition has a connective relationship of certain electric wire materials corresponding to a composite wire in a case that the plurality of the electric wire materials include the composite wire configured by the certain electric wire materials, and wherein in a case that the composite wire is included in the electric wire materials as the moving condition, in the inserting of the insertion-tried circle performed by the insertion unit and the searching for the destination position performed by the searching unit, the certain circles corresponding to the composite wire are respectively moved in accordance with the connective relationship corresponding to the composite wire and the whole composite wire is moved only when all the certain circles corresponding to the composite wire are movable.

4. A computer-readable recording medium having stored thereon computer executable instructions which, when executed, perform the calculation method as set forth in any one of claims 1 and 2.

* * * * *